United States Patent
Duparré

(10) Patent No.: US 9,247,117 B2
(45) Date of Patent: Jan. 26, 2016

(54) SYSTEMS AND METHODS FOR CORRECTING FOR WARPAGE OF A SENSOR ARRAY IN AN ARRAY CAMERA MODULE BY INTRODUCING WARPAGE INTO A FOCAL PLANE OF A LENS STACK ARRAY

(71) Applicant: Pelican Imaging Corporation, Santa Clara, CA (US)

(72) Inventor: Jacques Duparré, Jena (DE)

(73) Assignee: Pelican Imaging Corporation, Santa Clara, CA (US)

( * ) Notice: Subject to any disclaimer, the term of this patent is extended or adjusted under 35 U.S.C. 154(b) by 0 days.

(21) Appl. No.: 14/484,154

(22) Filed: Sep. 11, 2014

(65) Prior Publication Data

US 2015/0288861 A1    Oct. 8, 2015

Related U.S. Application Data

(60) Provisional application No. 61/976,335, filed on Apr. 7, 2014.

(51) Int. Cl.
*H04N 5/335* (2011.01)
*H04N 5/225* (2006.01)
*G02B 3/00* (2006.01)
*G02B 27/00* (2006.01)
*H04N 5/247* (2006.01)

(52) U.S. Cl.
CPC .......... *H04N 5/2254* (2013.01); *G02B 3/0012* (2013.01); *G02B 3/0062* (2013.01); *G02B 27/0025* (2013.01); *H04N 5/2258* (2013.01); *H04N 5/247* (2013.01)

(58) Field of Classification Search
CPC .......... H04N 5/23232; H04N 5/3415; H04N 3/1593; H04N 3/335; G03B 37/04
See application file for complete search history.

(56) References Cited

U.S. PATENT DOCUMENTS

| | | | |
|---|---|---|---|
| 4,124,798 A | 11/1978 | Thompson | |
| 4,198,646 A | 4/1980 | Alexander et al. | |
| 4,323,925 A | 4/1982 | Abell et al. | |
| 4,460,449 A | 7/1984 | Montalbano | |
| 4,467,365 A | 8/1984 | Murayama et al. | |

(Continued)

FOREIGN PATENT DOCUMENTS

| EP | 840502 A2 | 5/1998 |
|---|---|---|
| EP | 2336816 A2 | 6/2011 |

(Continued)

OTHER PUBLICATIONS

Muehlebach, "Camera Auto Exposure Control for VSLAM Applications", Studies on Mechatronics, Swiss Federal Institute of Technology Zurich, Autumn Term 2010 course, 67 pgs.

(Continued)

*Primary Examiner* — Tuan Ho
(74) *Attorney, Agent, or Firm* — KPPB LLP

(57) ABSTRACT

Systems and methods in accordance with embodiments of the invention provide an array camera module in which warpage is designed into the projection plane of images from a lens stack array to correct for warpage in a sensor of the array camera module. The resulting array camera modules has back focal lengths for each of the lens stacks in the lens stack array that are substantially consistent when placed over a sensor.

18 Claims, 10 Drawing Sheets

(56) References Cited

U.S. PATENT DOCUMENTS

| | | |
|---|---|---|
| 5,005,083 A | 4/1991 | Grage |
| 5,070,414 A | 12/1991 | Tsutsumi |
| 5,144,448 A | 9/1992 | Hornbaker |
| 5,327,125 A | 7/1994 | Iwase et al. |
| 5,629,524 A | 5/1997 | Stettner et al. |
| 5,808,350 A | 9/1998 | Jack et al. |
| 5,832,312 A | 11/1998 | Rieger et al. |
| 5,880,691 A | 3/1999 | Fossum et al. |
| 5,933,190 A | 8/1999 | Dierickx et al. |
| 5,973,844 A | 10/1999 | Burger |
| 6,002,743 A | 12/1999 | Telymonde |
| 6,034,690 A | 3/2000 | Gallery et al. |
| 6,069,351 A | 5/2000 | Mack |
| 6,069,365 A | 5/2000 | Chow et al. |
| 6,097,394 A | 8/2000 | Levoy et al. |
| 6,124,974 A | 9/2000 | Burger |
| 6,130,786 A | 10/2000 | Osawa et al. |
| 6,137,535 A | 10/2000 | Meyers |
| 6,141,048 A | 10/2000 | Meyers |
| 6,160,909 A | 12/2000 | Melen |
| 6,163,414 A | 12/2000 | Kikuchi et al. |
| 6,205,241 B1 | 3/2001 | Melen |
| 6,340,994 B1 | 1/2002 | Margulis et al. |
| 6,358,862 B1 | 3/2002 | Ireland et al. |
| 6,477,260 B1 | 11/2002 | Shimomura |
| 6,563,537 B1 | 5/2003 | Kawamura et al. |
| 6,603,513 B1 | 8/2003 | Berezin |
| 6,611,289 B1 | 8/2003 | Yu |
| 6,627,896 B1 | 9/2003 | Hashimoto et al. |
| 6,628,330 B1 | 9/2003 | Lin |
| 6,635,941 B2 | 10/2003 | Suda |
| 6,657,218 B2 | 12/2003 | Noda |
| 6,671,399 B1 | 12/2003 | Berestov |
| 6,750,904 B1 | 6/2004 | Lambert |
| 6,765,617 B1 | 7/2004 | Tangen et al. |
| 6,771,833 B1 | 8/2004 | Edgar |
| 6,774,941 B1 | 8/2004 | Boisvert et al. |
| 6,795,253 B2 | 9/2004 | Shinohara |
| 6,819,358 B1 | 11/2004 | Kagle et al. |
| 6,879,735 B1 | 4/2005 | Portniaguine et al. |
| 6,903,770 B1 | 6/2005 | Kobayashi et al. |
| 6,909,121 B2 | 6/2005 | Nishikawa |
| 6,958,862 B1 | 10/2005 | Joseph |
| 7,085,409 B2 | 8/2006 | Sawhney et al. |
| 7,161,614 B1 | 1/2007 | Yamashita et al. |
| 7,199,348 B2 | 4/2007 | Olsen et al. |
| 7,262,799 B2 | 8/2007 | Suda |
| 7,292,735 B2 | 11/2007 | Blake et al. |
| 7,295,697 B1 | 11/2007 | Satoh |
| 7,369,165 B2 | 5/2008 | Bosco et al. |
| 7,391,572 B2 | 6/2008 | Jacobowitz et al. |
| 7,408,725 B2 | 8/2008 | Sato |
| 7,606,484 B1 | 10/2009 | Richards et al. |
| 7,633,511 B2 | 12/2009 | Shum et al. |
| 7,646,549 B2 | 1/2010 | Zalevsky et al. |
| 7,657,090 B2 | 2/2010 | Omatsu et al. |
| 7,675,080 B2 | 3/2010 | Boettiger |
| 7,675,681 B2 | 3/2010 | Tomikawa et al. |
| 7,706,634 B2 | 4/2010 | Schmitt et al. |
| 7,723,662 B2 | 5/2010 | Levoy et al. |
| 7,782,364 B2 | 8/2010 | Smith |
| 7,826,153 B2 | 11/2010 | Hong |
| 7,840,067 B2 | 11/2010 | Shen et al. |
| 7,912,673 B2 | 3/2011 | Hébert et al. |
| 7,986,018 B2 | 7/2011 | Rennie |
| 7,990,447 B2 | 8/2011 | Honda et al. |
| 8,000,498 B2 | 8/2011 | Shih et al. |
| 8,013,904 B2 | 9/2011 | Tan et al. |
| 8,027,531 B2 | 9/2011 | Wilburn et al. |
| 8,044,994 B2 | 10/2011 | Vetro et al. |
| 8,077,245 B2 | 12/2011 | Adamo et al. |
| 8,098,304 B2 | 1/2012 | Pinto et al. |
| 8,106,949 B2 | 1/2012 | Tan et al. |
| 8,126,279 B2 | 2/2012 | Marcellin et al. |
| 8,130,120 B2 | 3/2012 | Kawabata et al. |
| 8,131,097 B2 | 3/2012 | Lelescu et al. |
| 8,164,629 B1 | 4/2012 | Zhang |
| 8,180,145 B2 | 5/2012 | Wu et al. |
| 8,189,089 B1 | 5/2012 | Georgiev |
| 8,213,711 B2 | 7/2012 | Tam |
| 8,231,814 B2 | 7/2012 | Duparre |
| 8,242,426 B2 | 8/2012 | Ward et al. |
| 8,244,027 B2 | 8/2012 | Takahashi |
| 8,254,668 B2 | 8/2012 | Mashitani et al. |
| 8,279,325 B2 | 10/2012 | Pitts et al. |
| 8,280,194 B2 | 10/2012 | Wong et al. |
| 8,294,099 B2 | 10/2012 | Blackwell, Jr. |
| 8,305,456 B1 | 11/2012 | McMahon |
| 8,315,476 B1 | 11/2012 | Georgiev et al. |
| 8,345,144 B1 | 1/2013 | Georgiev et al. |
| 8,360,574 B2 | 1/2013 | Ishak et al. |
| 8,400,555 B1 | 3/2013 | Georgiev |
| 8,406,562 B2 | 3/2013 | Bassi et al. |
| 8,446,492 B2 | 5/2013 | Nakano et al. |
| 8,514,491 B2 | 8/2013 | Duparre |
| 8,541,730 B2 | 9/2013 | Inuiya |
| 8,542,933 B2 | 9/2013 | Venkataraman et al. |
| 8,553,093 B2 | 10/2013 | Wong et al. |
| 8,559,756 B2 | 10/2013 | Georgiev et al. |
| 8,619,082 B1 | 12/2013 | Ciurea et al. |
| 8,655,052 B2 | 2/2014 | Spooner et al. |
| 8,682,107 B2 | 3/2014 | Yoon et al. |
| 8,692,893 B2 | 4/2014 | McMahon |
| 8,773,536 B1 | 7/2014 | Zhang |
| 8,780,113 B1 | 7/2014 | Ciurea et al. |
| 8,804,255 B2 | 8/2014 | Duparre |
| 8,830,375 B2 | 9/2014 | Ludwig |
| 8,831,367 B2 | 9/2014 | Venkataraman et al. |
| 8,854,462 B2 | 10/2014 | Herbin et al. |
| 8,861,089 B2 | 10/2014 | Duparre |
| 8,866,912 B2 | 10/2014 | Mullis |
| 8,866,920 B2 | 10/2014 | Venkataraman et al. |
| 8,878,950 B2 | 11/2014 | Lelescu et al. |
| 8,885,059 B1 | 11/2014 | Venkataraman et al. |
| 8,896,594 B2 | 11/2014 | Xiong et al. |
| 8,896,719 B1 | 11/2014 | Venkataraman et al. |
| 8,902,321 B2 | 12/2014 | Venkataraman et al. |
| 2001/0005225 A1 | 6/2001 | Clark et al. |
| 2001/0019621 A1 | 9/2001 | Hanna et al. |
| 2001/0038387 A1 | 11/2001 | Tomooka et al. |
| 2002/0012056 A1 | 1/2002 | Trevino |
| 2002/0027608 A1 | 3/2002 | Johnson |
| 2002/0039438 A1 | 4/2002 | Mori et al. |
| 2002/0063807 A1 | 5/2002 | Margulis |
| 2002/0087403 A1 | 7/2002 | Meyers et al. |
| 2002/0089596 A1 | 7/2002 | Suda |
| 2002/0094027 A1 | 7/2002 | Sato et al. |
| 2002/0101528 A1 | 8/2002 | Lee |
| 2002/0113867 A1 | 8/2002 | Takigawa et al. |
| 2002/0113888 A1 | 8/2002 | Sonoda et al. |
| 2002/0163054 A1 | 11/2002 | Suda et al. |
| 2002/0167537 A1 | 11/2002 | Trajkovic |
| 2002/0177054 A1 | 11/2002 | Saitoh et al. |
| 2003/0025227 A1 | 2/2003 | Daniell |
| 2003/0086079 A1 | 5/2003 | Barth et al. |
| 2003/0124763 A1 | 7/2003 | Fan et al. |
| 2003/0140347 A1 | 7/2003 | Varsa |
| 2003/0179418 A1 | 9/2003 | Wengender et al. |
| 2003/0190072 A1 | 10/2003 | Adkins et al. |
| 2003/0211405 A1 | 11/2003 | Venkataraman |
| 2004/0008271 A1 | 1/2004 | Hagimori et al. |
| 2004/0012689 A1 | 1/2004 | Tinnerino |
| 2004/0027358 A1 | 2/2004 | Nakao |
| 2004/0047274 A1 | 3/2004 | Amanai |
| 2004/0050104 A1 | 3/2004 | Ghosh et al. |
| 2004/0056966 A1 | 3/2004 | Schechner et al. |
| 2004/0066454 A1 | 4/2004 | Otani et al. |
| 2004/0100570 A1 | 5/2004 | Shizukuishi |
| 2004/0114807 A1 | 6/2004 | Lelescu et al. |
| 2004/0151401 A1 | 8/2004 | Sawhney et al. |
| 2004/0165090 A1 | 8/2004 | Ning |
| 2004/0169617 A1 | 9/2004 | Yelton et al. |
| 2004/0170340 A1 | 9/2004 | Tipping et al. |
| 2004/0174439 A1 | 9/2004 | Upton |

(56) References Cited

U.S. PATENT DOCUMENTS

| | | |
|---|---|---|
| 2004/0179834 A1 | 9/2004 | Szajewski |
| 2004/0207836 A1 | 10/2004 | Chhibber et al. |
| 2004/0213449 A1 | 10/2004 | Safaee-Rad et al. |
| 2004/0218809 A1 | 11/2004 | Blake et al. |
| 2004/0234873 A1 | 11/2004 | Venkataraman |
| 2004/0240052 A1 | 12/2004 | Minefuji et al. |
| 2004/0251509 A1 | 12/2004 | Choi |
| 2004/0264806 A1 | 12/2004 | Herley |
| 2005/0006477 A1 | 1/2005 | Patel |
| 2005/0012035 A1 | 1/2005 | Miller |
| 2005/0036778 A1 | 2/2005 | DeMonte |
| 2005/0047678 A1 | 3/2005 | Jones et al. |
| 2005/0048690 A1 | 3/2005 | Yamamoto |
| 2005/0068436 A1 | 3/2005 | Fraenkel et al. |
| 2005/0132098 A1 | 6/2005 | Sonoda et al. |
| 2005/0134712 A1 | 6/2005 | Gruhlke et al. |
| 2005/0147277 A1 | 7/2005 | Higaki et al. |
| 2005/0151759 A1 | 7/2005 | Gonzalez-Banos et al. |
| 2005/0175257 A1 | 8/2005 | Kuroki |
| 2005/0185711 A1 | 8/2005 | Pfister et al. |
| 2005/0205785 A1 | 9/2005 | Hornback et al. |
| 2005/0219363 A1 | 10/2005 | Kohler |
| 2005/0225654 A1 | 10/2005 | Feldman et al. |
| 2005/0275946 A1 | 12/2005 | Choo et al. |
| 2005/0286612 A1 | 12/2005 | Takanashi |
| 2006/0002635 A1 | 1/2006 | Nestares et al. |
| 2006/0023197 A1 | 2/2006 | Joel |
| 2006/0023314 A1 | 2/2006 | Boettiger et al. |
| 2006/0033005 A1 | 2/2006 | Jerdev et al. |
| 2006/0038891 A1 | 2/2006 | Okutomi et al. |
| 2006/0049930 A1 | 3/2006 | Zruya et al. |
| 2006/0054780 A1 | 3/2006 | Garrood et al. |
| 2006/0054782 A1 | 3/2006 | Olsen et al. |
| 2006/0055811 A1 | 3/2006 | Frtiz et al. |
| 2006/0069478 A1 | 3/2006 | Iwama |
| 2006/0072029 A1 | 4/2006 | Miyatake et al. |
| 2006/0087747 A1 | 4/2006 | Ohzawa et al. |
| 2006/0098888 A1 | 5/2006 | Morishita |
| 2006/0125936 A1 | 6/2006 | Gruhike et al. |
| 2006/0138322 A1 | 6/2006 | Costello et al. |
| 2006/0152803 A1 | 7/2006 | Provitola |
| 2006/0157640 A1 | 7/2006 | Perlman et al. |
| 2006/0159369 A1 | 7/2006 | Young |
| 2006/0176566 A1 | 8/2006 | Boettiger et al. |
| 2006/0187338 A1 | 8/2006 | May et al. |
| 2006/0203113 A1 | 9/2006 | Wada et al. |
| 2006/0210186 A1 | 9/2006 | Berkner |
| 2006/0239549 A1 | 10/2006 | Kelly et al. |
| 2006/0243889 A1 | 11/2006 | Farnworth et al. |
| 2006/0251410 A1 | 11/2006 | Trutna |
| 2006/0274174 A1 | 12/2006 | Tewinkle |
| 2006/0278948 A1 | 12/2006 | Yamaguchi et al. |
| 2006/0279648 A1 | 12/2006 | Senba et al. |
| 2007/0002159 A1 | 1/2007 | Olsen et al. |
| 2007/0024614 A1 | 2/2007 | Tam |
| 2007/0036427 A1 | 2/2007 | Nakamura et al. |
| 2007/0040828 A1 | 2/2007 | Zalevsky et al. |
| 2007/0040922 A1 | 2/2007 | McKee et al. |
| 2007/0041391 A1 | 2/2007 | Lin et al. |
| 2007/0052825 A1 | 3/2007 | Cho |
| 2007/0083114 A1 | 4/2007 | Yang et al. |
| 2007/0085917 A1 | 4/2007 | Kobayashi |
| 2007/0102622 A1 | 5/2007 | Olsen et al. |
| 2007/0126898 A1 | 6/2007 | Feldman |
| 2007/0127831 A1 | 6/2007 | Venkataraman |
| 2007/0139333 A1 | 6/2007 | Sato et al. |
| 2007/0146511 A1 | 6/2007 | Kinoshita et al. |
| 2007/0158427 A1 | 7/2007 | Zhu et al. |
| 2007/0159541 A1 | 7/2007 | Sparks et al. |
| 2007/0160310 A1 | 7/2007 | Tanida et al. |
| 2007/0165931 A1 | 7/2007 | Higaki |
| 2007/0171290 A1 | 7/2007 | Kroger |
| 2007/0211164 A1 | 9/2007 | Olsen et al. |
| 2007/0216765 A1 | 9/2007 | Wong et al. |
| 2007/0228256 A1 | 10/2007 | Mentzer |
| 2007/0257184 A1 | 11/2007 | Olsen et al. |
| 2007/0258006 A1 | 11/2007 | Olsen et al. |
| 2007/0258706 A1 | 11/2007 | Raskar et al. |
| 2007/0263114 A1 | 11/2007 | Gurevich et al. |
| 2007/0268374 A1 | 11/2007 | Robinson |
| 2007/0296835 A1 | 12/2007 | Olsen et al. |
| 2008/0019611 A1 | 1/2008 | Larkin |
| 2008/0024683 A1 | 1/2008 | Damera-Venkata et al. |
| 2008/0025649 A1 | 1/2008 | Liu et al. |
| 2008/0030597 A1 | 2/2008 | Olsen et al. |
| 2008/0043095 A1 | 2/2008 | Vetro et al. |
| 2008/0043096 A1 | 2/2008 | Vetro et al. |
| 2008/0062164 A1 | 3/2008 | Bassi et al. |
| 2008/0079805 A1 | 4/2008 | Takagi et al. |
| 2008/0080028 A1 | 4/2008 | Bakin et al. |
| 2008/0084486 A1 | 4/2008 | Enge et al. |
| 2008/0088793 A1 | 4/2008 | Sverdrup et al. |
| 2008/0095523 A1 | 4/2008 | Schilling-Benz et al. |
| 2008/0112635 A1 | 5/2008 | Kondo et al. |
| 2008/0118241 A1 | 5/2008 | Tekolste et al. |
| 2008/0131019 A1 | 6/2008 | Ng |
| 2008/0131107 A1 | 6/2008 | Ueno |
| 2008/0151097 A1 | 6/2008 | Chen et al. |
| 2008/0152215 A1 | 6/2008 | Horie et al. |
| 2008/0152296 A1 | 6/2008 | Oh et al. |
| 2008/0158259 A1 | 7/2008 | Kempf et al. |
| 2008/0158375 A1 | 7/2008 | Kakkori et al. |
| 2008/0187305 A1 | 8/2008 | Raskar et al. |
| 2008/0193026 A1 | 8/2008 | Horie et al. |
| 2008/0218610 A1 | 9/2008 | Chapman et al. |
| 2008/0219654 A1 | 9/2008 | Border et al. |
| 2008/0240598 A1 | 10/2008 | Hasegawa |
| 2008/0246866 A1* | 10/2008 | Kinoshita ............... G02B 7/02 348/294 |
| 2008/0247638 A1 | 10/2008 | Tanida et al. |
| 2008/0247653 A1 | 10/2008 | Moussavi et al. |
| 2008/0272416 A1 | 11/2008 | Yun |
| 2008/0273751 A1 | 11/2008 | Yuan et al. |
| 2008/0278591 A1 | 11/2008 | Barna et al. |
| 2008/0298674 A1 | 12/2008 | Baker et al. |
| 2009/0050946 A1 | 2/2009 | Duparre et al. |
| 2009/0052743 A1 | 2/2009 | Techmer |
| 2009/0060281 A1 | 3/2009 | Tanida et al. |
| 2009/0086074 A1 | 4/2009 | Li et al. |
| 2009/0091806 A1 | 4/2009 | Inuiya |
| 2009/0096050 A1 | 4/2009 | Park |
| 2009/0102956 A1 | 4/2009 | Georgiev |
| 2009/0109306 A1 | 4/2009 | Shan et al. |
| 2009/0128833 A1 | 5/2009 | Yahav |
| 2009/0167922 A1 | 7/2009 | Perlman et al. |
| 2009/0179142 A1 | 7/2009 | Duparre et al. |
| 2009/0180021 A1 | 7/2009 | Kikuchi et al. |
| 2009/0200622 A1 | 8/2009 | Tai et al. |
| 2009/0201371 A1 | 8/2009 | Matsuda et al. |
| 2009/0207235 A1 | 8/2009 | Francini et al. |
| 2009/0225203 A1 | 9/2009 | Tanida et al. |
| 2009/0237520 A1 | 9/2009 | Kaneko et al. |
| 2009/0263017 A1 | 10/2009 | Tanbakuchi |
| 2009/0268192 A1 | 10/2009 | Koenck et al. |
| 2009/0268970 A1 | 10/2009 | Babacan et al. |
| 2009/0268983 A1 | 10/2009 | Stone et al. |
| 2009/0274387 A1 | 11/2009 | Jin |
| 2009/0284651 A1 | 11/2009 | Srinivasan |
| 2009/0297056 A1 | 12/2009 | Lelescu et al. |
| 2009/0302205 A9 | 12/2009 | Olsen et al. |
| 2009/0323195 A1 | 12/2009 | Hembree et al. |
| 2009/0323206 A1 | 12/2009 | Oliver et al. |
| 2009/0324118 A1 | 12/2009 | Maslov et al. |
| 2010/0002126 A1 | 1/2010 | Wenstrand et al. |
| 2010/0002313 A1 | 1/2010 | Duparre et al. |
| 2010/0002314 A1 | 1/2010 | Duparre |
| 2010/0013927 A1 | 1/2010 | Nixon |
| 2010/0053342 A1 | 3/2010 | Hwang et al. |
| 2010/0053600 A1 | 3/2010 | Tanida et al. |
| 2010/0060746 A9 | 3/2010 | Olsen et al. |
| 2010/0085425 A1 | 4/2010 | Tan |
| 2010/0086227 A1 | 4/2010 | Sun et al. |
| 2010/0091389 A1 | 4/2010 | Henriksen et al. |
| 2010/0097491 A1 | 4/2010 | Farina et al. |

(56) References Cited

U.S. PATENT DOCUMENTS

| | | |
|---|---|---|
| 2010/0103259 A1 | 4/2010 | Tanida et al. |
| 2010/0103308 A1 | 4/2010 | Butterfield et al. |
| 2010/0111444 A1 | 5/2010 | Coffman |
| 2010/0118127 A1 | 5/2010 | Nam et al. |
| 2010/0133230 A1 | 6/2010 | Henriksen et al. |
| 2010/0141802 A1 | 6/2010 | Knight et al. |
| 2010/0142839 A1 | 6/2010 | Lakus-Becker |
| 2010/0157073 A1 | 6/2010 | Kondo et al. |
| 2010/0165152 A1 | 7/2010 | Lim |
| 2010/0177411 A1 | 7/2010 | Hegde et al. |
| 2010/0194901 A1 | 8/2010 | van Hoorebeke et al. |
| 2010/0195716 A1 | 8/2010 | Klein et al. |
| 2010/0201834 A1 | 8/2010 | Maruyama et al. |
| 2010/0208100 A9 | 8/2010 | Olsen et al. |
| 2010/0220212 A1 | 9/2010 | Perlman et al. |
| 2010/0231285 A1 | 9/2010 | Boomer et al. |
| 2010/0244165 A1 | 9/2010 | Lake et al. |
| 2010/0265385 A1 | 10/2010 | Knight et al. |
| 2010/0281070 A1 | 11/2010 | Chan et al. |
| 2010/0302423 A1 | 12/2010 | Adams, Jr. et al. |
| 2010/0321640 A1 | 12/2010 | Yeh et al. |
| 2011/0001037 A1 | 1/2011 | Tewinkle |
| 2011/0018973 A1 | 1/2011 | Takayama |
| 2011/0032370 A1 | 2/2011 | Ludwig |
| 2011/0043661 A1 | 2/2011 | Podoleanu |
| 2011/0043665 A1 | 2/2011 | Ogasahara |
| 2011/0043668 A1 | 2/2011 | McKinnon et al. |
| 2011/0069189 A1 | 3/2011 | Venkataraman et al. |
| 2011/0080487 A1 | 4/2011 | Venkataraman et al. |
| 2011/0108708 A1 | 5/2011 | Olsen et al. |
| 2011/0121421 A1 | 5/2011 | Charbon et al. |
| 2011/0122308 A1 | 5/2011 | Duparre |
| 2011/0128412 A1 | 6/2011 | Milnes et al. |
| 2011/0149408 A1 | 6/2011 | Hahgholt et al. |
| 2011/0149409 A1 | 6/2011 | Haugholt et al. |
| 2011/0153248 A1 | 6/2011 | Gu et al. |
| 2011/0157321 A1 | 6/2011 | Nakajima et al. |
| 2011/0176020 A1 | 7/2011 | Chang |
| 2011/0211824 A1 | 9/2011 | Georgiev et al. |
| 2011/0221599 A1 | 9/2011 | Högasten |
| 2011/0221658 A1 | 9/2011 | Haddick et al. |
| 2011/0221939 A1 | 9/2011 | Jerdev |
| 2011/0234841 A1 | 9/2011 | Akeley et al. |
| 2011/0241234 A1 | 10/2011 | Duparre |
| 2011/0242342 A1 | 10/2011 | Goma et al. |
| 2011/0242355 A1 | 10/2011 | Goma et al. |
| 2011/0242356 A1 | 10/2011 | Aleksic et al. |
| 2011/0255592 A1 | 10/2011 | Sung et al. |
| 2011/0267348 A1 | 11/2011 | Lin et al. |
| 2011/0273531 A1 | 11/2011 | Ito et al. |
| 2011/0274366 A1 | 11/2011 | Tardif |
| 2011/0279721 A1 | 11/2011 | McMahon |
| 2011/0285866 A1 | 11/2011 | Bhrugumalla et al. |
| 2011/0298917 A1 | 12/2011 | Yanagita |
| 2011/0300929 A1 | 12/2011 | Tardif et al. |
| 2011/0310980 A1 | 12/2011 | Mathew |
| 2011/0317766 A1 | 12/2011 | Lim et al. |
| 2012/0012748 A1 | 1/2012 | Pain et al. |
| 2012/0026297 A1 | 2/2012 | Sato |
| 2012/0026342 A1 | 2/2012 | Yu et al. |
| 2012/0039525 A1 | 2/2012 | Tian et al. |
| 2012/0044249 A1 | 2/2012 | Mashitani et al. |
| 2012/0044372 A1 | 2/2012 | Côté et al. |
| 2012/0069235 A1 | 3/2012 | Imai |
| 2012/0113413 A1 | 5/2012 | Miahczylowicz-Wolski et al. |
| 2012/0147139 A1 | 6/2012 | Li et al. |
| 2012/0147205 A1 | 6/2012 | Lelescu et al. |
| 2012/0153153 A1 | 6/2012 | Chang et al. |
| 2012/0154551 A1 | 6/2012 | Inoue |
| 2012/0170134 A1 | 7/2012 | Bolis et al. |
| 2012/0176479 A1 | 7/2012 | Mayhew et al. |
| 2012/0198677 A1 | 8/2012 | Duparre |
| 2012/0200734 A1 | 8/2012 | Tang |
| 2012/0218455 A1* | 8/2012 | Imai .................. G02B 13/001 348/340 |
| 2012/0229628 A1 | 9/2012 | Ishiyama et al. |
| 2012/0249550 A1 | 10/2012 | Akeley et al. |
| 2012/0262607 A1 | 10/2012 | Shimura et al. |
| 2012/0287291 A1 | 11/2012 | McMahon et al. |
| 2012/0293695 A1 | 11/2012 | Tanaka |
| 2012/0314033 A1 | 12/2012 | Lee et al. |
| 2012/0327222 A1 | 12/2012 | Ng et al. |
| 2013/0002828 A1 | 1/2013 | Ding et al. |
| 2013/0003184 A1 | 1/2013 | Duparre |
| 2013/0010073 A1 | 1/2013 | Do |
| 2013/0022111 A1 | 1/2013 | Chen et al. |
| 2013/0027580 A1 | 1/2013 | Olsen et al. |
| 2013/0033579 A1 | 2/2013 | Wajs |
| 2013/0050504 A1 | 2/2013 | Safaee-Rad et al. |
| 2013/0050526 A1 | 2/2013 | Keelan |
| 2013/0057710 A1 | 3/2013 | McMahon |
| 2013/0070060 A1 | 3/2013 | Chatterjee |
| 2013/0076967 A1 | 3/2013 | Brunner et al. |
| 2013/0077880 A1 | 3/2013 | Venkataraman et al. |
| 2013/0077882 A1 | 3/2013 | Venkataraman et al. |
| 2013/0088637 A1 | 4/2013 | Duparre |
| 2013/0113899 A1 | 5/2013 | Morohoshi et al. |
| 2013/0120605 A1 | 5/2013 | Georgiev et al. |
| 2013/0128068 A1 | 5/2013 | Georgiev et al. |
| 2013/0128069 A1 | 5/2013 | Georgiev et al. |
| 2013/0128087 A1 | 5/2013 | Georgiev et al. |
| 2013/0128121 A1 | 5/2013 | Agarwala et al. |
| 2013/0147979 A1 | 6/2013 | McMahon et al. |
| 2013/0215108 A1 | 8/2013 | McMahon et al. |
| 2013/0222556 A1 | 8/2013 | Shimada |
| 2013/0229540 A1 | 9/2013 | Farina et al. |
| 2013/0259317 A1 | 10/2013 | Gaddy |
| 2013/0265459 A1 | 10/2013 | Duparre et al. |
| 2014/0009586 A1 | 1/2014 | McNamer et al. |
| 2014/0076336 A1 | 3/2014 | Clayton et al. |
| 2014/0079336 A1 | 3/2014 | Venkataraman et al. |
| 2014/0092281 A1 | 4/2014 | Nisenzon et al. |
| 2014/0132810 A1 | 5/2014 | McMahon |
| 2014/0176592 A1 | 6/2014 | Wilburn et al. |
| 2014/0198188 A1 | 7/2014 | Izawa |
| 2014/0218546 A1 | 8/2014 | McMahon |
| 2014/0232822 A1 | 8/2014 | Venkataraman et al. |
| 2014/0240528 A1 | 8/2014 | Venkataraman et al. |
| 2014/0240529 A1 | 8/2014 | Venkataraman et al. |
| 2014/0253738 A1 | 9/2014 | Mullis |
| 2014/0267243 A1 | 9/2014 | Venkataraman et al. |
| 2014/0267286 A1 | 9/2014 | Duparre |
| 2014/0267633 A1 | 9/2014 | Venkataraman et al. |
| 2014/0267762 A1 | 9/2014 | Mullis et al. |
| 2014/0267890 A1 | 9/2014 | Lelescu et al. |
| 2014/0285675 A1 | 9/2014 | Mullis |
| 2014/0321712 A1 | 10/2014 | Ciurea et al. |
| 2014/0333731 A1 | 11/2014 | Venkataraman et al. |
| 2014/0333764 A1 | 11/2014 | Venkataraman et al. |
| 2014/0333787 A1 | 11/2014 | Venkataraman et al. |
| 2014/0340539 A1 | 11/2014 | Venkataraman et al. |
| 2014/0347509 A1 | 11/2014 | Venkataraman et al. |
| 2014/0347748 A1 | 11/2014 | Duparre |
| 2014/0354773 A1 | 12/2014 | Venkataraman et al. |
| 2014/0354843 A1 | 12/2014 | Venkataraman et al. |
| 2014/0354844 A1 | 12/2014 | Venkataraman et al. |
| 2014/0354853 A1 | 12/2014 | Venkataraman et al. |
| 2014/0354854 A1 | 12/2014 | Venkataraman et al. |
| 2014/0354855 A1 | 12/2014 | Venkataraman et al. |
| 2014/0355870 A1 | 12/2014 | Venkataraman et al. |
| 2014/0368662 A1 | 12/2014 | Venkataraman et al. |
| 2014/0368683 A1 | 12/2014 | Venkataraman et al. |
| 2014/0368684 A1 | 12/2014 | Venkataraman et al. |
| 2014/0368685 A1 | 12/2014 | Venkataraman et al. |
| 2014/0368686 A1 | 12/2014 | Duparre |
| 2014/0369612 A1 | 12/2014 | Venkataraman et al. |
| 2014/0369615 A1 | 12/2014 | Venkataraman et al. |
| 2014/0376825 A1 | 12/2014 | Venkataraman et al. |
| 2014/0376826 A1 | 12/2014 | Venkataraman et al. |
| 2015/0003752 A1 | 1/2015 | Venkataraman et al. |
| 2015/0003753 A1 | 1/2015 | Venkataraman et al. |
| 2015/0009353 A1 | 1/2015 | Venkataraman et al. |

(56) References Cited

U.S. PATENT DOCUMENTS

| | | | |
|---|---|---|---|
| 2015/0009354 A1 | 1/2015 | Venkataraman et al. |
| 2015/0009362 A1 | 1/2015 | Venkataraman et al. |
| 2015/0015669 A1 | 1/2015 | Venkataraman et al. |

FOREIGN PATENT DOCUMENTS

| | | | |
|---|---|---|---|
| JP | 2006033493 A | 2/2006 |
| JP | 2007520107 A | 7/2007 |
| JP | 2011109484 A | 6/2011 |
| JP | 2013526801 A | 6/2013 |
| JP | 2014521117 A | 8/2014 |
| WO | 2007083579 A1 | 7/2007 |
| WO | 2008108271 A1 | 9/2008 |
| WO | 2009151903 A2 | 12/2009 |
| WO | 2011063347 A2 | 5/2011 |
| WO | 2011116203 A1 | 9/2011 |
| WO | 2011063347 A3 | 10/2011 |
| WO | 2011143501 A1 | 11/2011 |
| WO | 2012057619 A1 | 5/2012 |
| WO | 2012057620 A2 | 5/2012 |
| WO | 2012057621 A1 | 5/2012 |
| WO | 2012057622 A1 | 5/2012 |
| WO | 2012057623 A1 | 5/2012 |
| WO | 2012057620 A3 | 6/2012 |
| WO | 2012074361 A1 | 6/2012 |
| WO | 2012078126 A1 | 6/2012 |
| WO | 2012082904 A1 | 6/2012 |
| WO | 2012155119 A1 | 11/2012 |
| WO | 2013003276 A1 | 1/2013 |
| WO | 2013043751 A1 | 3/2013 |
| WO | 2013043761 A1 | 3/2013 |
| WO | 2013049699 A1 | 4/2013 |
| WO | 2013055960 A1 | 4/2013 |
| WO | 2013119706 A1 | 8/2013 |
| WO | 2013126578 A1 | 8/2013 |
| WO | 2014052974 A2 | 4/2014 |
| WO | 2014032020 A3 | 5/2014 |
| WO | 2014078443 A1 | 5/2014 |
| WO | 2014130849 A1 | 8/2014 |
| WO | 2014133974 A1 | 9/2014 |
| WO | 2014138695 A1 | 9/2014 |
| WO | 2014138697 A1 | 9/2014 |
| WO | 2014144157 A1 | 9/2014 |
| WO | 2014145856 A1 | 9/2014 |
| WO | 2014149403 A1 | 9/2014 |
| WO | 2014149902 A1 | 9/2014 |
| WO | 2014150856 A1 | 9/2014 |
| WO | 2014159721 A1 | 10/2014 |
| WO | 2014159779 A1 | 10/2014 |
| WO | 2014160142 A1 | 10/2014 |
| WO | 2014164550 A2 | 10/2014 |
| WO | 2014164909 A1 | 10/2014 |
| WO | 2014165244 A1 | 10/2014 |

OTHER PUBLICATIONS

Nayar, "Computational Cameras: Redefining the Image", IEEE Computer Society, Aug. 2006, pp. 30-38.
Ng, "Digital Light Field Photography", Thesis, Jul. 2006, 203 pgs.
Ng et al., "Super-Resolution Image Restoration from Blurred Low-Resolution Images", Journal of Mathematical Imaging and Vision, 2005, vol. 23, pp. 367-378.
Nitta et al., "Image reconstruction for thin observation module by bound optics by using the iterative backprojection method", Applied Optics, May 1, 2006, vol. 45, No. 13, pp. 2893-2900.
Nomura et al., "Scene Collages and Flexible Camera Arrays", Proceedings of Eurographics Symposium on Rendering, 2007, 12 pgs.
Park et al., "Super-Resolution Image Reconstruction", IEEE Signal Processing Magazine, May 2003, pp. 21-36.
Pham et al., "Robust Super-Resolution without Regularization", Journal of Physics: Conference Series 124, 2008, pp. 1-19.
Polight, "Designing Imaging Products Using Reflowable Autofocus Lenses", http://www.polight.no/tunable-polymer-autofocus-lens-html--11.html.
Protter et al., "Generalizing the Nonlocal-Means to Super-Resolution Reconstruction", IEEE Transactions on Image Processing, Jan. 2009, vol. 18, No. 1, pp. 36-51.
Radtke et al., "Laser lithographic fabrication and characterization of a spherical artificial compound eye", Optics Express, Mar. 19, 2007, vol. 15, No. 6, pp. 3067-3077.
Rander et al., "Virtualized Reality: Constructing Time-Varying Virtual Worlds From Real World Events", Proc. of IEEE Visualization '97, Phoenix, Arizona, Oct. 19-24, 1997, pp. 277-283, 552.
Rhemann et al, "Fast Cost-Volume Filtering for Visual Correspondence and Beyond", IEEE Trans. Pattern Anal. Mach. Intell, 2013, vol. 35, No. 2, pp. 504-511.
Robertson et al., "Dynamic Range Improvement Through Multiple Exposures", In Proc. of the Int. Conf. on Image Processing, 1999, 5 pgs.
Robertson et al., "Estimation-theoretic approach to dynamic range enhancement using multiple exposures", Journal of Electronic Imaging, Apr. 2003, vol. 12, No. 2, pp. 219-228.
Roy et al., "Non-Uniform Hierarchical Pyramid Stereo for Large Images", Computer and Robot Vision, 2007, pp. 208-215.
Sauer et al., "Parallel Computation of Sequential Pixel Updates in Statistical Tomographic Reconstruction", ICIP 1995, pp. 93-96.
Seitz et al., "Plenoptic Image Editing", International Journal of Computer Vision 48, 2, pp. 115-129.
Shum et al., "Pop-Up Light Field: An Interactive Image-Based Modeling and Rendering System," Apr. 2004, ACM Transactions on Graphics, vol. 23, No. 2, pp. 143-162. Retrieved from http://131.107.65.14/en-us/um/people/jiansun/papers/PopupLightField_TOG.pdf on Feb. 5.
Stollberg et al., "The Gabor superlens as an alternative wafer-level camera approach inspired by superposition compound eyes of nocturnal insects", Optics Express, Aug. 31, 2009, vol. 17, No. 18, pp. 15747-15759.
Sun et al., "Image Super-Resolution Using Gradient Profile Prior", Source and date unknown, 8 pgs.
Takeda et al., "Super-resolution Without Explicit Subpixel Motion Estimation", IEEE Transaction on Image Processing, Sep. 2009, vol. 18, No. 9, pp. 1958-1975.
Tanida et al., "Color imaging with an integrated compound imaging system", Optics Express, Sep. 8, 2003, vol. 11, No. 18, pp. 2109-2117.
Tanida et al., "Thin observation module by bound optics (TOMBO): concept and experimental verification", Applied Optics, Apr. 10, 2001, vol. 40, No. 11, pp. 1806-1813.
Taylor, "Virtual camera movement: The way of the future?", American Cinematographer 77, (Sep. 9), 93-100.
Vaish et al., "Reconstructing Occluded Surfaces Using Synthetic Apertures: Stereo, Focus and Robust Measures", Proceeding, CVPR '06 Proceedings of the 2006 IEEE Computer Society Conference on Computer Vision and Pattern Recognition—vol. 2, pp. 2331-2338.
Vaish et al., "Synthetic Aperture Focusing Using a Shear-Warp Factorization of the Viewing Transform", IEEE Workshop on A3DISS, CVPR, 2005, 8 pgs.
Vaish et al., "Using Plane + Parallax for Calibrating Dense Camera Arrays", IEEE Conference on Computer Vision and Pattern Recognition (CVPR), 2004, 8 pgs.
Veilleux, "CCD Gain Lab: The Theory", University of Maryland, College Park-Observational Astronomy (ASTR 310), Oct. 19, 2006, pp. 1-5 (online), [retrieved on May 13, 2014]. Retrieved from the Internet <URL:http://www.astro.umd.edu/~veilleux/ASTR310/fall06/ccd_theory.pdf, 5 pgs.
Vuong et al., "A New Auto Exposure and Auto White-Balance Algorithm to Detect High Dynamic Range Conditions Using CMOS Technology", Proceedings of the World Congress on Engineering and Computer Science 2008, WCECS 2008, Oct. 22-24, 2008.
Wang, "Calculation of Image Position, Size and Orientation Using First Order Properties", 10 pgs.
Wetzstein et al., "Computational Plenoptic Imaging", Computer Graphics Forum, 2011, vol. 30, No. 8, pp. 2397-2426.
Wheeler et al., "Super-Resolution Image Synthesis Using Projections Onto Convex Sets in the Frequency Domain", Proc. SPIE, 2005, 5674, 12 pgs.

(56) References Cited

OTHER PUBLICATIONS

Wikipedia, "Polarizing Filter (Photography)", http://en.wikipedia.org/wiki/Polarizing_filter_(photography), 1 pg.
Wilburn, "High Performance Imaging Using Arrays of Inexpensive Cameras", Thesis of Bennett Wilburn, Dec. 2004, 128 pgs.
Wilburn et al., "High Performance Imaging Using Large Camera Arrays", ACM Transactions on Graphics, Jul. 2005, vol. 24, No. 3, pp. 765-776.
Wilburn et al., "High-Speed Videography Using a Dense Camera Array", Proceeding, CVPR'04 Proceedings of the 2004 IEEE Computer Society Conference on Computer Vision and Pattern Recognition, pp. 294-301.
Wilburn et al., "The Light Field Video Camera", Proceedings of Media Processors 2002, SPIE Electronic Imaging, 2002, 8 pgs.
Wippermann et al., "Design and fabrication of a chirped array of refractive ellipsoidal micro-lenses for an apposition eye camera objective", Proceedings of SPIE, Optical Design and Engineering II, Oct. 15, 2005, 59622C-1-59622C-11.
Yang et al., "A Real-Time Distributed Light Field Camera", Eurographics Workshop on Rendering (2002), pp. 1-10.
Yang et al., "Superresolution Using Preconditioned Conjugate Gradient Method", Source and date unknown, 8 pgs.
Zhang et al., "A Self-Reconfigurable Camera Array", Eurographics Symposium on Rendering, 2004, 12 pgs.
Zomet et al., "Robust Super-Resolution", IEEE, 2001, pp. 1-6.
Bruckner et al., "Artificial compound eye applying hyperacuity", Optics Express, Dec. 11, 2006, vol. 14, No. 25, pp. 12076-12084.
Bruckner et al., "Driving microoptical imaging systems towards miniature camera applications", Proc. SPIE, Micro-Optics, 2010, 11 pgs.
Bruckner et al., "Thin wafer-level camera lenses inspired by insect compound eyes", Optics Express, Nov. 22, 2010, vol. 18, No. 24, pp. 24379-24394.
Capel, "Image Mosaicing and Super-resolution", [online], Retrieved on Nov. 10, 2012. Retrieved from the Internet at URL:<http://citeseerx.ist.psu.edu/viewdoc/download?doi=10.1.1.226.2643&rep=rep1&type=pdf>, Title pg., abstract, table of contents, pp. 1-263 (269 total pages).
Chan et al., "Extending the Depth of Field in a Compound-Eye Imaging System with Super-Resolution Reconstruction", Proceedings—International Conference on Pattern Recognition, 2006, vol. 3, pp. 623-626.
Chan et al., "Investigation of Computational Compound-Eye Imaging System with Super-Resolution Reconstruction", IEEE, ISASSP 2006, pp. 1177-1180.
Chan et al., "Super-resolution reconstruction in a computational compound-eye imaging system", Multidim Syst Sign Process, 2007, vol. 18, pp. 83-101.
Chen et al., "Interactive deformation of light fields", In Proceedings of SIGGRAPH I3D 2005, pp. 139-146.
Drouin et al., "Fast Multiple-Baseline Stereo with Occlusion", Proceedings of the Fifth International Conference on 3-D Digital Imaging and Modeling, 2005, 8 pgs.
Drouin et al., "Geo-Consistency for Wide Multi-Camera Stereo", Proceedings of the 2005 IEEE Computer Society Conference on Computer Vision and Pattern Recognition, 2005, 8 pgs.
Drouin et al., "Improving Border Localization of Multi-Baseline Stereo Using Border-Cut", International Journal of Computer Vision, Jul. 2009, vol. 83, Issue 3, 8 pgs.
Duparre et al., "Artificial apposition compound eye fabricated by micro-optics technology", Applied Optics, Aug. 1, 2004, vol. 43, No. 22, pp. 4303-4310.
Duparre et al., "Artificial compound eye zoom camera", Bioinspiration & Biomimetics, 2008, vol. 3, pp. 1-6.
Duparre et al., "Artificial compound eyes—different concepts and their application to ultra flat image acquisition sensors", MOEMS and Miniaturized Systems IV, Proc. SPIE 5346, Jan. 2004, pp. 89-100.
Duparre et al., "Chirped arrays of refractive ellipsoidal microlenses for aberration correction under oblique incidence", Optics Express, Dec. 26, 2005, vol. 13, No. 26, pp. 10539-10551.
Duparre et al., "Micro-optical artificial compound eyes", Bioinspiration & Biomimetics, 2006, vol. 1, pp. R1-R16.
Duparre et al., "Microoptical artificial compound eyes—from design to experimental verification of two different concepts", Proc. of SPIE, Optical Design and Engineering II, vol. 5962, pp. 59622A-1-59622A-12.
Duparre et al., "Microoptical Artificial Compound Eyes—Two Different Concepts for Compact Imaging Systems", 11th Microoptics Conference, Oct. 30-Nov. 2, 2005, 2 pgs.
Duparre et al., "Microoptical telescope compound eye", Optics Express, Feb. 7, 2005, vol. 13, No. 3, pp. 889-903.
Duparre et al., "Micro-optically fabricated artificial apposition compound eye", Electronic Imaging—Science and Technology, Prod. SPIE 5301, Jan. 2004, pp. 25-33.
Duparre et al., "Novel Optics/Micro-Optics for Miniature Imaging Systems", Proc. of SPIE, 2006, vol. 6196, pp. 619607-1-619607-15.
Duparre et al., "Theoretical analysis of an artificial superposition compound eye for application in ultra flat digital image acquisition devices", Optical Systems Design, Proc. SPIE 5249, Sep. 2003, pp. 408-418.
Duparre et al., "Thin compound-eye camera", Applied Optics, May 20, 3005, vol. 44, No. 15, pp. 2949-2956.
Duparre et al., "Ultra-Thin Camera Based on Artificial Apposistion Compound Eyes", 10th Microoptics Conference, Sep. 1-3, 2004, 2 pgs.
Fanaswala, "Regularized Super-Resolution of Multi-View Images", Retrieved on Nov. 10, 2012. Retrieved from the Internet at URL:<http://www.site.uottawa.ca/-edubois/theses/Fanaswala_thesis.pdf>, 163 pgs.
Farrell et al., "Resolution and Light Sensitivity Tradeoff with Pixel Size", Proceedings of the SPIE Electronic Imaging 2006 Conference, 2006, vol. 6069, 8 pgs.
Farsiu et al., "Advances and Challenges in Super-Resolution", International Journal of Imaging Systems and Technology, 2004, vol. 14, pp. 47-57.
Farsiu et al., "Fast and Robust Multiframe Super Resolution", IEEE Transactions on Image Processing, Oct. 2004, vol. 13, No. 10, pp. 1327-1344.
Farsiu et al., "Multiframe Demosaicing and Super-Resolution of Color Images", IEEE Transactions on Image Processing, Jan. 2006, vol. 15, No. 1, pp. 141-159.
Feris et al., "Multi-Flash Stereopsis: Depth Edge Preserving Stereo with Small Baseline Illumination", IEEE Trans on PAMI, 2006, 31 pgs.
Fife et al., "A 3D Multi-Aperture Image Sensor Architecture", Custom Integrated Circuits Conference, 2006, CICC '06, IEEE, pp. 281-284.
Fife et al., "A 3MPixel Multi-Aperture Image Sensor with 0.7Mu Pixels in 0.11Mu CMOS", ISSCC 2008, Session 2, Image Sensors & Technology, 2008, pp. 48-50.
Fischer et al., Optical System Design, 2nd Edition, SPIE Press, pp. 191-198.
Fischer et al., Optical System Design, 2nd Edition, SPIE Press, pp. 49-58.
Goldman et al., "Video Object Annotation, Navigation, and Composition", In Proceedings of UIST 2008, pp. 3-12.
Gortler et al., "The Lumigraph", In Proceedings of SIGGRAPH 1996, pp. 43-54.
Hacohen et al., "Non-Rigid Dense Correspondence with Applications for Image Enhancement", ACM Transactions on Graphics, 30, 4, 2011, pp. 70:1-70:10.
Hamilton, "JPEG File Interchange Format, Version 1.02", Sep. 1, 1992, 9 pgs.
Hardie, "A Fast Image Super-Algorithm Using an Adaptive Wiener Filter", IEEE Transactions on Image Processing, Dec. 2007, vol. 16, No. 12, pp. 2953-2964.
Hasinoff et al., "Search-and-Replace Editing for Personal Photo Collections", Computational Photography (ICCP) 2010, pp. 1-8.
Horisaki et al., "Irregular Lens Arrangement Design to Improve Imaging Performance of Compound-Eye Imaging Systems", Applied Physics Express, 2010, vol. 3, pp. 022501-1-022501-3.

(56) References Cited

OTHER PUBLICATIONS

Horisaki et al., "Superposition Imaging for Three-Dimensionally Space-Invariant Point Spread Functions", Applied Physics Express, 2011, vol. 4, pp. 112501-1-112501-3.
Horn et al., "LightShop: Interactive Light Field Manipulation and Rendering", In Proceedings of I3D 2007, pp. 121-128.
Isaksen et al., "Dynamically Reparameterized Light Fields", In Proceedings of SIGGRAPH 2000, pp. 297-306.
Jarabo et al., "Efficient Propagation of Light Field Edits", in Proceedings of SIACG 2011, pp. 75-80.
Joshi et al., "Synthetic Aperture Tracking: Tracking Through Occlusions", I CCV IEEE 11th International Conference on Computer Vision; Publication [online]. Oct. 2007 [retrieved Jul. 28, 2014]. Retrieved from the Internet: <URL:http:I/ieeexplore.ieee.org/stamp/stamp.jsp?tp=&arnumber=4409032&isnumber=4408819>; pp. 1-8.
Kang et al., "Handling Occlusions inn Dense Multi-View Stereo", Computer Vision and Pattern Recognition, 2001, vol. 1, pp. I-103-I-110.
Kitamura et al., "Reconstruction of a high-resolution image on a compound-eye image-capturing system", Applied Optics, Mar. 10, 2004, vol. 43, No. 8, pp. 1719-1727.
Krishnamurthy et al., "Compression and Transmission of Depth Maps for Image-Based Rendering", Image Processing, 2001, pp. 828-831.
Kutulakos et al., "Occluding Contour Detection Using Affine Invariants and Purposive Viewpoint Control", Proc., CVPR 94, 8 pgs.
Lensvector, "How LensVector Autofocus Works", printed Nov. 2, 2012 from http://www.lensvector.com/overview.html, 1 pg.
Levoy, "Light Fields and Computational Imaging", IEEE Computer Society, Aug. 2006, pp. 46-55.
Levoy et al., "Light Field Rendering", Proc. ADM SIGGRAPH '96, pp. 1-12.
Li et al., "A Hybrid Camera for Motion Deblurring and Depth Map Super-Resolution," Jun. 23-28, 2008, IEEE Conference on Computer Vision and Pattern Recognition, 8 pgs. Retrieved from www.eecis. udel.edu/~jye/lab_research/08/deblur-feng.pdf on Feb. 5, 2014.
Liu et al., "Virtual View Reconstruction Using Temporal Information", 2012 IEEE International Conference on Multimedia and Expo, 2012, pp. 115-120.
Lo et al., "Stereoscopic 3D Copy & Paste", ACM Transactions on Graphics, vol. 29, No. 6, Article 147, Dec. 2010, pp. 147:1-147:10.
International Preliminary Report on Patentability for International Application No. PCT/US2012/059813, Search Completed Apr. 15, 2014, 7 pgs.
International Preliminary Report on Patentability for International Application PCT/US2013/024987, Mailed Aug. 21, 2014, 13 Pgs.
International Preliminary Report on Patentability for International Application PCT/US2013/027146, Report Completed Apr. 2, 2013, Report Issued Aug. 26, 2014, 10 pages.
International Preliminary Report on Patentability for International Application PCT/US2013/039155, completed Nov. 4, 2014, Mailed Nov. 13, 2014, 10 Pgs.
International Preliminary Report on Patentability for International Application PCT/US2013/046002, Report completed Dec. 31, 2014, Mailed Jan. 8, 2015, 6 Pgs.
International Preliminary Report on Patentability for International Application PCT/US2013/048772, Report completed Dec. 31, 2014, Mailed Jan. 8, 2015, 8 Pgs.
International Search Report and Written Opinion for International Application No. PCT/US13/46002, Search completed Nov. 13, 2013, Mailed Nov. 29, 2013, 7 pgs.
International Search Report and Written Opinion for International Application No. PCT/US13/56065, Search Completed Nov. 25, 2013, Mailed Nov. 26, 2013, 8 pgs.
International Search Report and Written Opinion for International Application No. PCT/US13/59991, Completed Feb. 6, 2014, Mailed Feb. 26, 2014, 8 pgs.
International Search Report and Written Opinion for International Application No. PCT/US2009/044687, completed Jan. 5, 2010, date mailed Jan. 13, 2010, 9 pgs.
International Search Report and Written Opinion for International Application No. PCT/US2011/64921, Report Completed Feb. 25, 2011, mailed Mar. 6, 2012, 17 pgs.
International Search Report and Written Opinion for International Application No. PCT/US2013/024987, Completed Mar. 27, 2013, Mailed Apr. 15, 2013, 14 pgs.
International Search Report and Written Opinion for International Application No. PCT/US2013/027146, completed Apr. 2, 2013, 12 pgs.
International Search Report and Written Opinion for International Application No. PCT/US2013/048772, Search Completed Oct. 21, 2013, Mailed Nov. 8, 2013, 6 pgs.
International Search Report and Written Opinion for International Application No. PCT/US2013/056502, Completed Feb. 18, 2014, Mailed Mar. 19, 2014, 7 pgs.
International Search Report and Written Opinion for International Application No. PCT/US2013/069932, Search Completed Mar. 14, 2014, Mailed Apr. 14, 2014, 12 pgs.
International Search Report and Written Opinion for International Application PCT/US11/36349, mailed Aug. 22, 2011, 11 pgs.
International Search Report and Written Opinion for International Application PCT/US13/62720, report completed Mar. 25, 2014, Mailed Apr. 21, 2014, 9 Pgs.
International Search Report and Written Opinion for International Application PCT/US14/024903 report completed Jun. 12, 2014, Mailed, Jun. 27, 2014, 13 pgs.
International Search Report and Written Opinion for International Application PCT/US14/17766, report completed May 28, 2014, 9 Pgs.
International Search Report and Written Opinion for International Application PCT/US14/18084, completed May 23, 2014, Mailed Jun. 10, 2014, 12 Pgs.
International Search Report and Written Opinion for International Application PCT/US14/18116, Report completed May 13, 2014, 12 pgs.
International Search Report and Written Opinion for International Application PCT/US14/22118, report completed Jun. 9, 2014, Mailed Jun. 25, 2014, 5 pgs.
International Search Report and Written Opinion for International Application PCT/US14/22774 report completed Jun. 9, 2014, Mailed Jul. 14, 2014, 6 Pgs.
International Search Report and Written Opinion for International Application PCT/US14/24407, report completed Jun. 11, 2014, Mailed Jul. 8, 2014, 9 Pgs.
International Search Report and Written Opinion for International Application PCT/US14/25100, report completed Jul. 7, 2014, Mailed Aug. 7, 2014 5 Pgs.
International Search Report and Written Opinion for International Application PCT/US14/25904 report completed Jun. 10, 2014, Mailed Jul. 10, 2014, 6 Pgs.
International Search Report and Written Opinion for International Application PCT/US2010/057661, completed Mar. 9, 2011, 14 pgs.
International Search Report and Written Opinion for International Application PCT/US2012/044014, completed Oct. 12, 2012, 15 pgs.
International Search Report and Written Opinion for International Application PCT/US2012/056151, completed Nov. 14, 2012, 10 pgs.
International Search Report and Written Opinion for International Application PCT/US2012/059813, Report completed Dec. 17, 2012, 8 pgs.
International Search Report and Written Opinion for International Application PCT/US2012/37670, Mailed Jul. 18, 2012, completed Jul. 5, 2012, 9 pgs.
International Search Report and Written Opinion for International Application PCT/US2012/58093, Report completed Nov. 15, 2012, 12 pgs.
International Search Report and Written Opinion for International Application PCT/US2014/022123, completed Jun. 9, 2014, Mailed Jun. 25, 2014, 5 pgs.
International Search Report and Written Opinion for International Application PCT/US2014/024947, completed Jul. 8, 2014, Mailed Aug. 5, 2014, 8 Pgs.

(56) References Cited

OTHER PUBLICATIONS

International Search Report and Written Opinion for International Application PCT/US2014/028447, completed Jun. 30, 2014, Mailed Jul. 21, 2014, 8 Pgs.

International Search Report and Written Opinion for International Application PCT/US2014/030692, completed Jul. 28, 2014, Mailed Aug. 27, 2014, 7 Pages.

International Search Report and Written Opinion for International Application PCT/US2014/23762, Completed May 30, 2014, Mailed Jul. 3, 2014, 6 Pgs.

International Search Report and Written Opinion for International Application PCT/US14/21439, completed Jun. 5, 2014, Mailed Jun. 20, 2014, 10 Pgs.

Office Action for U.S. Appl. No. 12/952,106, dated Aug. 16, 2012, 12 pgs.

Baker et al., "Limits on Super-Resolution and How to Break Them", IEEE Transactions on Pattern Analysis and Machine Intelligence, Sep. 2002, vol. 24, No. 9, pp. 1167-1183.

Bertero et al., "Super-resolution in computational imaging", Micron, 2003, vol. 34, Issues 6-7, 17 pgs.

Bishop et al., "Full-Resolution Depth Map Estimation from an Aliased Plenoptic Light Field", ACCV 2010, Part II, LNCS 6493, pp. 186-200.

Bishop et al., "Light Field Superresolution", Retrieved from http://home.eps.hw.ac.uk/~sz73/ICCP09/LightFieldSuperresolution.pdf, 9 pgs.

Bishop et al., "The Light Field Camera: Extended Depth of Field, Aliasing, and Superresolution", IEEE Transactions on Pattern Analysis and Machine Intelligence, May 2012, vol. 34, No. 5, pp. 972-986.

Borman, "Topics in Multiframe Superresolution Restoration", Thesis of Sean Borman, Apr. 2004, 282 pgs.

Borman et al, "Image Sequence Processing", Source unknown, Oct. 14, 2002, 81 pgs.

Borman et al., "Block-Matching Sub-Pixel Motion Estimation from Noisy, Under-Sampled Frames—An Empirical Performance Evaluation", Proc SPIE, Dec. 1998, 3653, 10 pgs.

Borman et al., "Image Resampling and Constraint Formulation for Multi-Frame Super-Resolution Restoration", Proc. SPIE, Jun. 2003, 5016, 12 pgs.

Borman et al., "Linear models for multi-frame super-resolution restoration under non-affine registration and spatially varying PSF", Proc. SPIE, May 2004, vol. 5299, 12 pgs.

Borman et al., "Nonlinear Prediction Methods for Estimation of Clique Weighting Parameters in NonGaussian Image Models", Proc. SPIE, 1998. 3459, 9 pgs.

Borman et al., "Simultaneous Multi-Frame MAP Super-Resolution Video Enhancement Using Spatio-Temporal Priors", Image Processing, 1999, ICIP 99 Proceedings, vol. 3, pp. 469-473.

Borman et al., "Super-Resolution from Image Sequences—A Review", Circuits & Systems, 1998, pp. 374-378.

Bose et al., "Superresolution and Noise Filtering Using Moving Least Squares", IEEE Transactions on Image Processing, date unknown, 21 pgs.

Boye et al., "Comparison of Subpixel Image Registration Algorithms", Proc. of SPIE-IS&T Electronic Imaging, vol. 7246, pp. 72460X-1-72460X-9.

\* cited by examiner

SYSTEMS AND METHODS FOR CORRECTING FOR WARPAGE OF A SENSOR ARRAY IN AN ARRAY CAMERA MODULE BY INTRODUCING WARPAGE INTO A FOCAL PLANE OF A LENS STACK ARRAY

CROSS-REFERENCE TO RELATED APPLICATION

The present invention claims priority under 35 U.S.C. §119 (e) to U.S. Provisional Patent Application Ser. No. 61/976,335 entitled "Sensor Array Warpage Compensation by Intentionally Introducing Warpage into the Lens Array", filed Apr. 7, 2014, the disclosure of which is incorporated by reference herein in its entirety.

FIELD OF THE INVENTION

The present invention generally relates to reducing the variation of the back focal length of lens in a lens stack array of an array camera module.

BACKGROUND

In response to the constraints placed upon a traditional digital camera based upon the camera obscura, a new class of cameras that can be referred to as array cameras has been proposed. Array cameras are characterized in that they include an imager array, or sensor, that has multiple arrays of pixels, where each pixel array is intended to define a focal plane, and each focal plane has a separate lens stack. Typically, each focal plane includes a plurality of rows of pixels that also forms a plurality of columns of pixels, and each focal plane is contained within a region of the imager that does not contain pixels from another focal plane. An image is typically formed on each focal plane by its respective lens stack. In many instances, the array camera is constructed using an imager array that incorporates multiple focal planes and an optic array of lens stacks.

SUMMARY OF THE INVENTION

An advance in the art is by systems and methods for correcting warpage of a sensor array in an array camera module by introducing warpage into a projection plane of images formed by the lens stack in accordance with at least some embodiments of this invention. In accordance with some embodiments of the invention, an array camera includes an array camera module. The array camera module includes a sensor and a lens stack array. The sensor includes an array of pixels that is subdivided into a sub-arrays of pixels and each of the sub-arrays forms a focal plane. The lens stack array includes a set of lens stacks. Each of lens stacks includes an aperture and forms an image on a focal plane formed by one of the sub-array of pixels on the sensor. The surface of the sensor on which images are formed includes a warpage and a projection plane of images formed by the lens stack array incorporates a warpage that at least partially corrects the warpage in the sensor.

In accordance with some embodiments, the warpage of the sensor has a curvature of a bow that is convex. In accordance with some embodiments, the warpage of the focal plane of the lens stack array has a curvature of a bow that is convex.

In accordance with many embodiments, the curvature of the warpage of the focal of the lens stack array is substantially equal to the curvature of the warpage of the sensor.

In accordance with some embodiments, the warpage of the lens stack array corrects the warpage of the sensor to provide back focal lengths for each of the lens stacks in the lens stack array that are substantially consistent.

In accordance with some embodiments, a method of manufacturing array cameras that correct for warpage in a sensor array with warpage in the focal plane of a lens stack is performed in the following manner. A first set of sensors for camera arrays are manufactured. Each of the sensors includes an array of pixels that is subdivided into of sub-arrays of pixels and each of the sub-arrays forms a focal plane. The warpage in each of the sensors manufactured is measured and used to generate warpage information. A lens stack array comprising a set of lens stacks where each of the lens stacks is associated with a focal plane formed by one of the sub-arrays of pixels in the sensor is designed based upon the warpage information. The designed lens stack array is configured to have a projection plane of images formed by the lens stack array that has a warpage that corrects the warpage in the sensor. A second set of sensors is manufactured and a lens stack arrays are manufactured in accordance with the design. The lens stack are then placed over the sensor to form and array camera module.

In accordance with some embodiments the lens stacks in each of the stack arrays is aligned with focal planes formed by the plurality of sub-arrays in each of the second set of sensors. In accordance with a number of embodiments, the warpage in the lens stack array design corrects the warpage of the first set of sensors to provide back focal lengths for each of the lens stacks in the lens stack array that are substantially consistent when placed over the second set of sensors.

DETAILED DESCRIPTION

Figure 1:
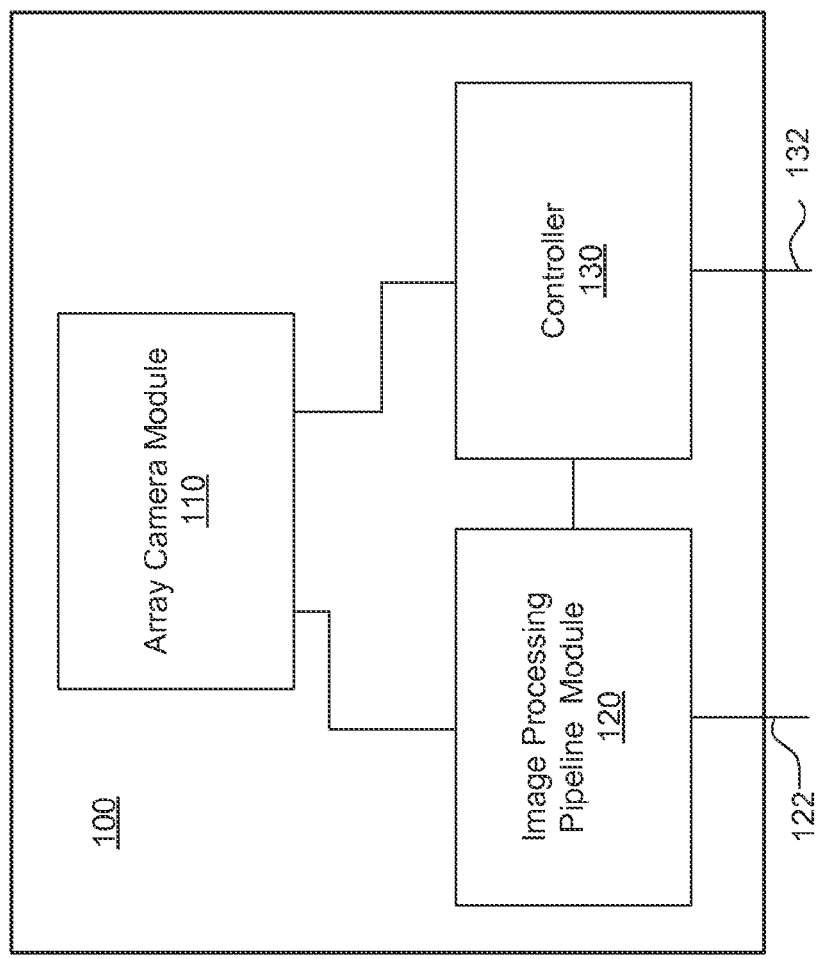
FIG. 1 conceptually illustrates an array camera in accordance with an embodiment of the invention.

Turning now to the drawings, systems and methods for correcting warpage of a sensor of an array camera module by introducing warpage into a lens stack array in accordance with embodiments of the invention are illustrated. Processes for constructing array camera modules using lens stack arrays are described in U.S. Patent Publication No. 20011/0069189, entitled "Capturing and Processing of Images Using Monolithic Camera Array with Heterogeneous Imagers", Venkataraman et al. The disclosure of U.S. Patent Publication No. 20011/0069189 is incorporated by reference herein in its entirety. The monolithic array camera modules illustrated in U.S. Patent Publication No. 20011/0069189 can be constructed from an optic array of lens stacks, also termed a 'lens stack array', where each lens stack in the array defines an optical channel, and where the lens stack array is associated with a monolithic imager array, or 'sensor', including a plurality of focal planes corresponding to the optical channels in the lens stack array. Each focal plane can include a plurality of rows of pixels that also forms a plurality of columns of pixels, and each focal plane may be contained within a region of the imager array that does not contain pixels from another focal plane. An image may be formed on each focal plane by a respective lens stack. The combination of a lens stack array and a sensor can be understood to be an 'array camera module' and the combination of an individual lens stack and its corresponding focal plane within the sensor can be understood to be a 'camera.' Ideally, the lens stack array of an array camera is constructed so that each lens stack within it has the same focal length. However, the large number of tolerances involved in the manufacture of a lens stack array can result in the different lens stacks having varying focal lengths. The combination of all the manufacturing process variations typically results in a deviation of the actual ("first order") lens parameters—such as focal length—from the nominal prescription. As a result, each lens stack can have a different axial optimum image location. And consequently, since the sensor is monolithic, it typically cannot be placed a distance that corresponds with the focal length of each camera within an array camera module. There are a variety of processes in the manufacturing of conventional camera modules that can be utilized to align a lens stack array with a sensor to achieve acceptable imaging performance including active alignment processes and passive alignment processes.

One particular problem that arises during manufacture is that the lens stack array and/or the sensor may not be sufficiently flat when the components are combined into an array camera module. If either the lens stack array (or more particularly, the projection plane of the images projected from the lens stack) and/or the sensor are warped, the individual lens stacks may be misaligned with the desired focal planes when the lens stack array is affixed to the sensor causing varying focusing problems to arise. The sensor may be warped due to many factors, including, but not limited to, mismatch issues of the Coefficient of Thermal Expansion (CTE) of material of the sensor and of the Printed Circuit Board (PCB) during the attachment process in which the components are subjects to elevated curing temperatures. The lens stack array (or more particularly, the projection plane of the images projected from the lens stack) may be warped due to factors including, but not limited, manufacturing defects in the lens stack arrays and the stress induced by placement of the lens stack into a holder over the sensor. Although much of the discussion that follows refers to sensor warpage, the techniques described herein can be equally applied to correct any form of sensor deformation as appropriate to the requirements of specific manufacturing processes in accordance with embodiments of the invention.

The warpage of the lens stack array and/or the sensor may cause the distance and/or angle between the individual lens stacks and individual pixel arrays in the sensor to vary. This variation in distance and/or angle may cause a back focal length variation of the individual lens in the lens array over the focal planes on the sensor array of the array camera that is referred to as warpage of the projection plane of the lens stack where the projection plane is the plane in which the images are focused. Typically, the curvature sign of the bow of the warpage of the sensor is convex while the curvature sign of the bow of the warpage of the projection plane of the lens stack array may vary between convex and concave. Commonly, the only way to minimize back focal length variations is to minimize the warpage in between the projection plane of the lens stack and the sensor prior to alignment.

In accordance with some embodiments of this invention, the variations in the back focal lengths of the individual lens stacks in the lens stack array are reduced by matching the warpage of the sensor and the warpage in the projection plane of lens stack array such that the warpage in the projection plane of the lens stack array corrects for the warpage of the sensor. In accordance with some embodiments, the warpage may be corrected by forming the components such that the curvature sign of the bows for each component are substantially equal to one another. In accordance with some other embodiments, the warpage in the sensor may be corrected by varying the BFL of individual lens stacks in the lens stack array such that the curvature sign of the warpage of the projection plane is substantially equal to the curvature sign of the warpage of the sensor. The equality of the curvature signs of the deformation in the sensor and the projection plane of the lens stacks results in a defocusing pattern in the array camera that is substantially free of the bow. The variation in the resulting Back Focal Length (BFL) pattern of the array camera module is decreased relative to an array camera module manufactured using a planar lens stack array (i.e. a lens stack array manufactured to minimize warpage).

In accordance with some embodiments of the invention, the process for manufacturing an array camera module includes manufacturing and/or packaging a sensor without enforcing a flatness requirement. The warpage of the manufactured sensor can be measured to determine warpage information for the sensor. The warpage information for the sensor can be used to design a lens stack array with a warpage in the projection plane that corrects for the warpage in the sensor. In accordance with some embodiments, the warpage in the sensor is corrected by having a warpage in the lens stack array that has a bow curvature sign that is substantially equal to the bow curvature sign of the manufactured sensor array. In accordance with some other embodiments, the warpage in the sensor may be corrected by varying the BFL of individual lens stacks in the lens stack array such that the curvature sign of the warpage of the focal plane is substantially equal to the curvature sign of the warpage of the sensor. Conventional alignment and assembly processes can then be used to align the lens stack relative to the sensor and form an array camera module.

A process for manufacturing individual lens array stacks for each sensor array would costly and time consuming. Furthermore, while the magnitude of warpage observed in the sensor may be significant. For example the warpage may be as much as 25 µm. However, the variation of the warpage between sensors arrays manufactured in the same manufacturing lot is typically less than 5 µm and is more typically on the order of 3 µm. Thus, a process for matching the warpage of a lot of produced lens stack arrays to warpage in a lot of manufactured sensors arrays may be performed in in accordance with embodiments of this invention to reduce the BFL-variation in mass produced array camera modules. In some embodiments of this invention, the process includes manufacturing a group of sensors in an array using a standard process without enforcing flatness requirements. The warpage of each of the produced sensors in the group are then measured to generate warpage information. In accordance with some embodiments the warpage information may include an average bow curvature sign of the group of sensors. The warpage information of the group of sensors is then used to design a lens stack arrays with warpage of the array image surface that corrects for the warpage in sensors. In accordance with some embodiments, the lens stack array design has a bow curvature sign that is substantially equal to the bow curvature sign of the warpage in the group of sensors. Lens stack arrays can then be manufactured in accordance with the design and additional sensors can be manufactured in accordance with the process used to manufacture the initial group of sensors that formed the basis of the lens stack array design. Conventional alignment and assembly processes can then be used to form array camera modules from the lens stack arrays and sensors. The resulting array camera modules can have reduced BFL-variation relative to array camera modules manufactured without modifying the design of the lens stack arrays based upon the measured warpage of the initial group of sensors. In many instances, designing the lens stack array considering measured sensor warpage can increase array camera module yield and provide reductions in manufacturing costs.

Alignment of sensors and lens stack arrays may be performed using active/or passive alignment. In the context of the manufacture of camera systems, the term active alignment typically refers to a process for aligning an optical component or element (e.g. a lens stack array) with an image receiving component or element (e.g. a monolithic sensor) to achieve a final desirable spatial arrangement by evaluating the efficacy of the image receiving component's ability to capture and record images as a function of the spatial relationship between the optical component and the image receiving component, and using this evaluation information to assist in the alignment process. Processes for actively aligning a lens stack array with an array of focal planes are described in U.S. Patent Publication No. 2014/0002674, entitled "Systems and Methods for Manufacturing Camera Modules Using Active Alignment of Lens Stack Arrays and Sensors", Duparre et al. The disclosure of U.S. Patent Application Publication No. 2014/0002674 is incorporated by reference herein in its entirety.

Ideally, when manufacturing camera modules in bulk, each camera module would be individually assembled using a rigorous assembly process, such as an active alignment process, to provide a quality configuration. However, performing such processes in bulk may be costly and time-consuming. An alternative to the use of an active alignment process to manufacture camera modules is the use of a passive alignment process. The term passive alignment typically refers to aligning an optical system with an imaging system to achieve a final desirable spatial arrangement using predetermined configuration parameters (e.g., the spacing between the lens stack array and the sensor is predetermined). Processes for utilizing alignment information obtained during active alignment of one or more representative lens stack arrays and sensors to form array camera modules to manufacture array camera modules using passive alignment processes are disclosed in U.S. patent application Ser. No. 14/195,675 entitled "Passive Alignment of Array Camera Modules Constructed from Lens Stack Arrays and Sensors Based Upon Alignment Information Obtained During Manufacture of Array Camera Modules Using an Active Alignment Process" to Duparre et al. The disclosure of U.S. patent application Ser. No. 14/195,675 is incorporated by reference herein in its entirety.

Processes for aligning lens stack arrays with sensors in accordance with many embodiments of the invention involve aligning the lens stack arrays with respect to sensors so as to enhance the resulting array camera module's ability to produce high-resolution images using super-resolution processes. Super-resolution refers to the process of synthesizing a plurality of low-resolution images of a particular scene—each image providing a sub-pixel shifted view of that scene (i.e. the object space sampled by the pixels is shifted relative to the other images captured by the array camera)—to derive a corresponding high-resolution image. Essentially, in a super-resolution process, sampling diversity between the low resolution images of a scene captured by an array camera module is utilized to synthesize one or more high resolution images of the scene. Thus, an array camera can capture and record a plurality of low-resolution images, and employ a super-resolution algorithm to generate a high-resolution image. Super-resolution processes that can be used to synthesize high resolution images from a plurality of low resolution images of a scene are described in U.S. Patent Publication 2012/014205 entitled "System and Methods for Synthesizing High Resolution Images Using Super-Resolution Processes" published Jun. 14, 2012, the disclosure of which is incorporated by reference herein in its entirety.

The extent to which super-resolution processing can be utilized to obtain an increase in resolution of an image synthesized from a plurality of low resolution images can depend on the sampling diversity and sharpness of the images. Importantly, the sampling diversity of the captured low resolution images is partly a function of the spatial relationship between the lens stack array and the sensor. Thus, many embodiments of the invention further align the lens stack array with the array of focal planes to enhance the sampling diversity within the corresponding array camera module by discovering and implementing a spatial relationship between the lens stack array and the sensor that enables this result.

Array cameras and systems and methods for correcting warpage of a sensor of an array camera module by manufacturing lens stack arrays that include warpages that at least partially corrects for the warpage in the sensor in accordance with embodiments of the invention are discussed further below.

Array Camera Architectures

A variety of architectures can be utilized to construct an array camera using one or more array camera modules and a processor, including (but not limited to) the array camera architectures disclosed in U.S. Application Publication 2011/0069189. A representative array camera architecture incorporating an array camera module incorporating a warped sensor and a lens stack array incorporating warpage that at least partially corrects for the warpage in the sensor and a processor is illustrated in FIG. 1. The array camera 100 includes an array camera module 110, which is connected to an image processing pipeline module 120 and to a controller 130. In the illustrated embodiment, the image processing pipeline and the controller 130 are implemented using a processor. In various embodiments, the image processing pipeline module 120 is hardware, firmware, software, or a combination for processing the images received from the array camera module 110. The image processing pipeline module 120 is capable of processing multiple images captured by multiple focal planes in the camera module and can produce a synthesized higher resolution image. In a number of embodiments, the image processing pipeline module 120 provides the synthesized image data via an output 122.

In many embodiments, the controller 130 is hardware, software, firmware, or a combination thereof for controlling various operational parameters of the array camera module 110. The controller 130 receives inputs 132 from a user or other external components and sends operation signals to control the array camera module 110. The controller can also send information to the image processing pipeline module 120 to assist processing of the images captured by the focal planes in the array camera module 110.

Although specific array camera architecture is illustrated in FIG. 1, camera modules incorporating a warped sensor and a lens stack array incorporating warpage that at least partially corrects for the warpage in the sensor in accordance with embodiments of the invention can be utilized in any of a variety of array camera architectures. Camera modules that can be utilized in array cameras and processes for manufacturing array camera modules in accordance with embodiments of the invention are discussed further below.

Array Camera Modules

An array camera module may be formed by aligning a lens stack array and an imager array. Each lens stack in the lens stack array can include an aperture that defines a separate optical channel. The lens stack array may be mounted to an imager array that includes a focal plane for each of the optical channels, where each focal plane includes an array of pixels or sensor elements configured to capture an image. When the lens stack array and the imager array are combined with sufficient precision, the array camera module can be utilized to capture image data from multiple views of a scene that can be read out to a processor for further processing, e.g., to synthesize a high resolution image using super-resolution processing.

Figure 2:
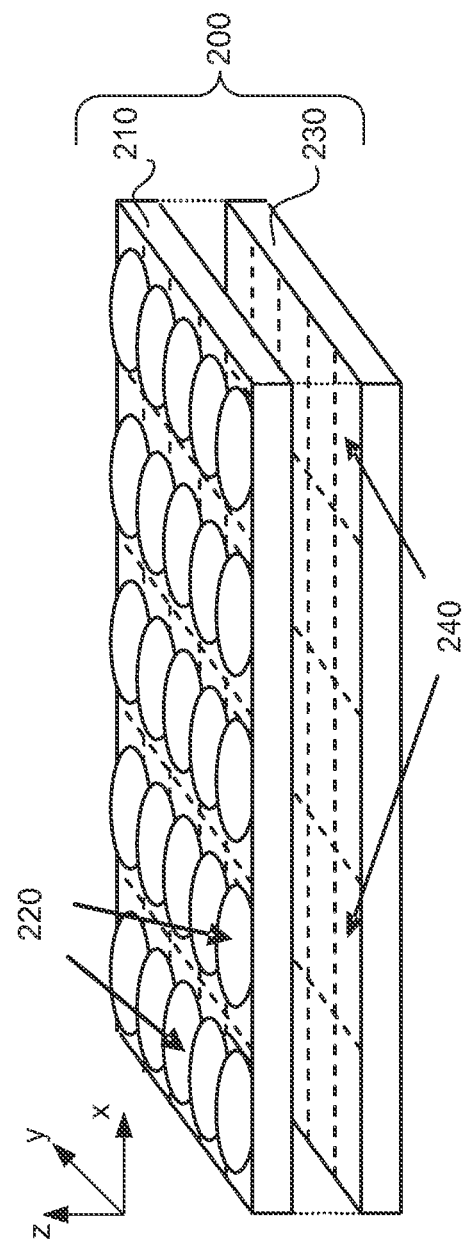
FIG. 2 illustrates an array camera module in accordance with an embodiment of the invention.
Figure 3:
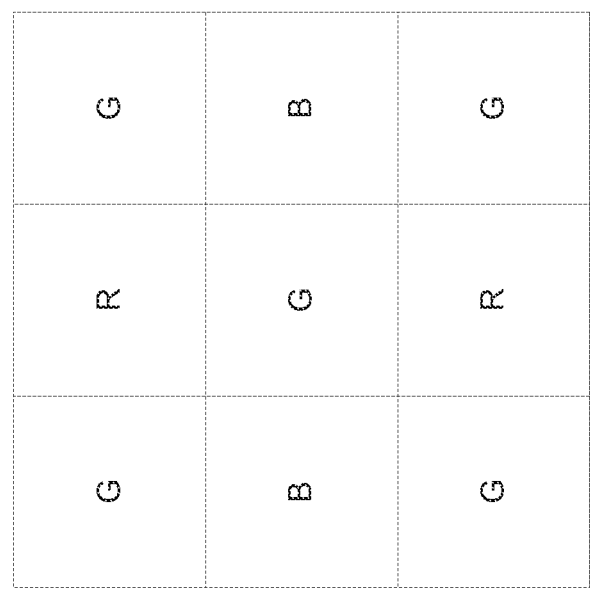
FIG. 3 illustrates an array camera module that employs a π filter in accordance with an embodiment of the invention.

An exploded view of an array camera module formed by combining a lens stack array with a monolithic sensor including an array of focal planes in accordance with an embodiment of the invention is illustrated in FIG. 2. The array camera module 200 includes a lens stack array 210 and a sensor 230 that includes an array of focal planes 240. The lens stack array 210 includes an array of lens stacks 220. Each lens stack creates an optical channel that resolves an image on the focal planes 240 on the sensor. Each of the lens stacks may be of a different type. For example, the optical channels may be used to capture images at different portions of the spectrum and the lens stack in each optical channel may be specifically optimized for the portion of the spectrum imaged by the focal plane associated with the optical channel. More specifically, an array camera module may be patterned with "π filter groups." The term π filter groups refers to a pattern of color filters applied to the lens stack array of a camera module and processes for patterning array cameras with π filter groups are described in U.S. Patent Publication 2013/0293228, entitled "Camera Modules Patterned with π Filter Groups", Venkataraman et al. The disclosure relevant to π filter groups in U.S. Patent Publication 2013/0293228 is incorporated by reference herein in its entirety. FIG. 3 illustrates a single 7 filter group, wherein 5 lenses are configured to receive green light, 2 lenses are configured to receive red light, and 2 lenses are configured to receive blue light. The lens stacks may further have one or multiple separate optical elements axially arranged with respect to each other.

A lens stack array may employ wafer level optics (WLO) technology. WLO is a technology that encompasses a number of processes, including, for example, molding of lens arrays on glass wafers, stacking of those wafers (including wafers having lenses replicated on either side of the substrate) with appropriate spacers, followed by packaging of the optics directly with the imager into a monolithic integrated module.

The WLO procedure may involve, among other procedures, using a diamond-turned mold to create each plastic lens element on a glass substrate. More specifically, the process chain in WLO generally includes producing a diamond turned lens master (both on an individual and array level), then producing a negative mould for replication of that master (also called a stamp or tool), and then finally forming a polymer replica on a glass substrate, which has been structured with appropriate supporting optical elements, such as, for example, apertures (transparent openings in light blocking material layers), and filters.

Although the construction of lens stack arrays using specific WLO processes is discussed above, any of a variety of techniques can be used to construct lens stack arrays, for instance those involving precision glass molding, polymer injection molding or wafer level polymer monolithic lens processes. Issues related to variation in back focal length of the lens stacks within lens stack arrays are discussed below.

Back Focal Plane Alignment

An array camera module is typically intended to be constructed in such a way that each focal plane (i.e. an array of pixels configured to capture an image formed on the focal plane by a corresponding lens stack) is positioned at the focal distance of each lens stack that forms an optical channel. However, manufacturing variations can result in the lens stack in each optical channel varying from its prescription, and in many instances, these variations can result in each lens stack within a lens stack array having a different focal length. For example, parameters that may vary amongst individual lens stacks in a lens stack array because of manufacturing variations include, but are not limited to: the radius of curvature in individual lenses, the conic, higher order aspheric coefficient, refractive index, thickness of the base layer, and/or overall lens height. As one of ordinary skill in the art would appreciate, any number of lens prescriptions may be used to characterize the lens fabrication process, and the respective tolerances may involve departures from these prescriptions in any number of ways, each of which may impact the back focal length. Due to the monolithic nature of the sensor, the spatial relationship of the focal planes (with respect to the lens stacks) cannot be individually customized to accommodate this variability.

Figure 4:
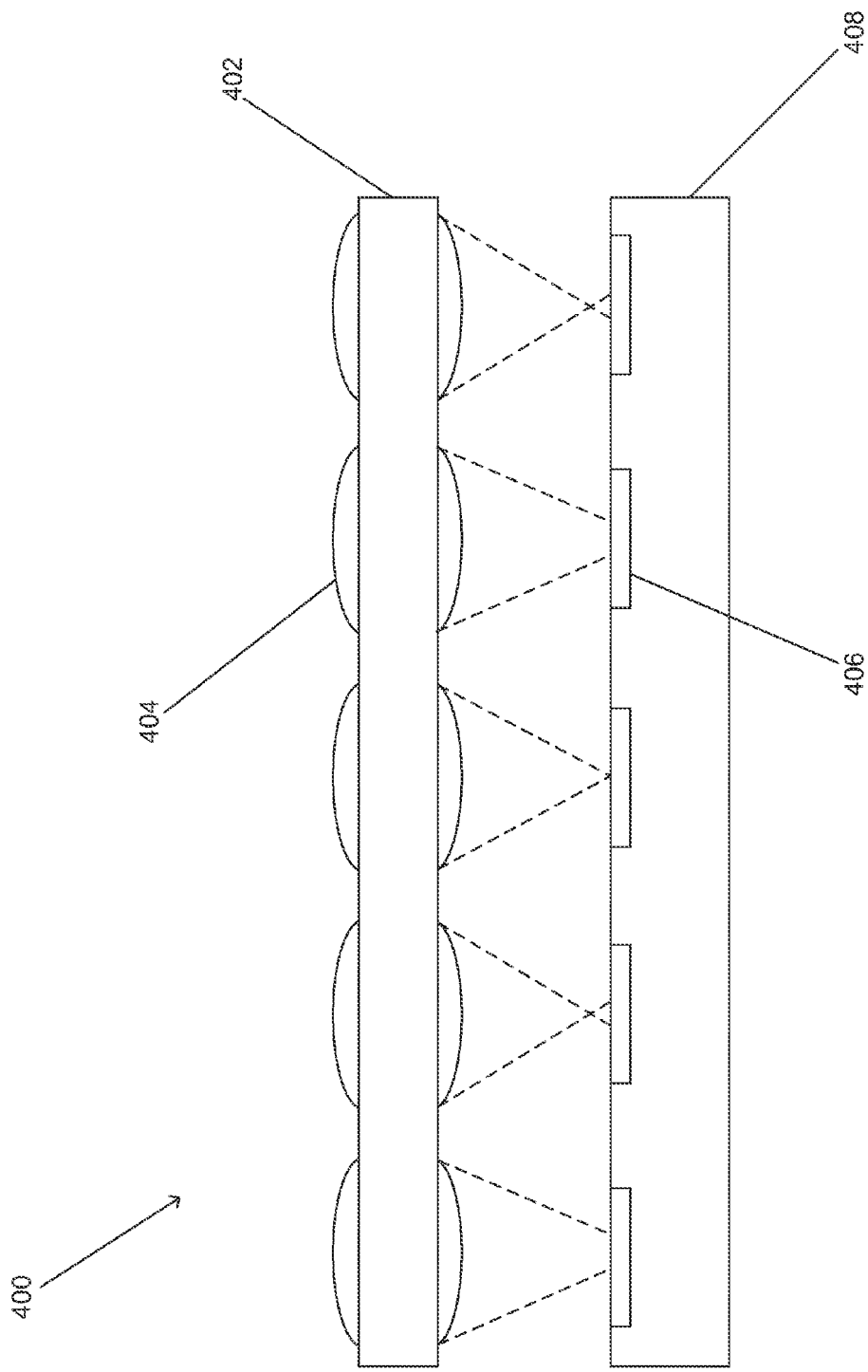
FIG. 4 conceptually illustrates variations in focal length that can occur during the manufacture of an array camera module using a lens stack array and a sensor in accordance with embodiments of the invention.

The variations in focal length that can occur in a conventional lens stack array are conceptually illustrated in FIG. 4. The array camera module 400 includes a lens stack array 402 in which lens stacks 404 focus light on the focal planes 406 of sensor 408. As is illustrated, variance between the actually fabricated lens stack and its original prescription can result in the lens stack having a focal length that varies slightly from its prescription and consequently an image distance that does not correspond with the distance between the lens stack array and the sensor. Accordingly, the images formed on the focal planes of the sensor can be out of focus. In addition, other manufacturing tolerances associated with the assembly of the array camera module including (but not limited to) variations in spacer thickness and alignment of the lens stack array relative to the sensor can impact all of the optical channels. Therefore, as discussed in U.S. Patent Publication 2014/0002674, active alignment processes may be incorporated in the manufacture of array camera modules to mitigate this effect.

Figure 5:
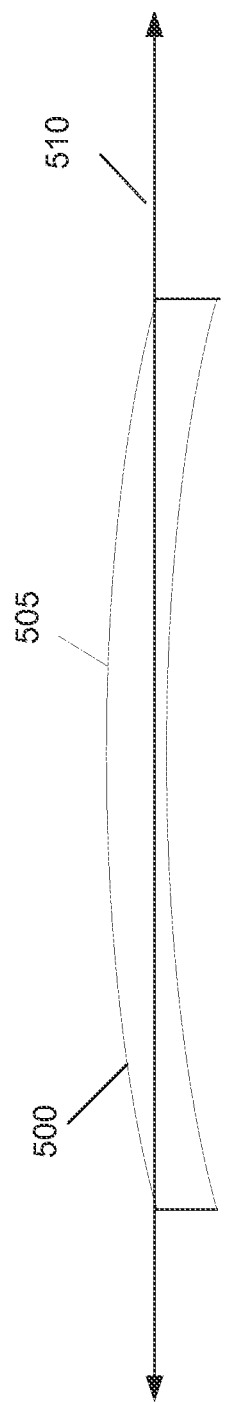
FIG. 5 conceptually illustrates a convex warpage of a sensor of an array camera in accordance with embodiments of this invention.

One cause of variations in the focal lengths in a lens stack array is warpage of the lens stack array and/or sensor. A side view of a sensor showing a convex warpage of a sensor in accordance with an embodiment of the invention is shown in FIG. 5. Although warpage is discussed with reference to the sensor, the discussion equally applies to a lens stack array. In FIG. 5, sensor 500 has warpage causing the sensor 500 to have a convex bow. Typically stress induced during the packaging of a sensor, e.g. mounting onto a PCB, leads to a convex bow in a sensor such as sensor 500. By convex, it is understood that convex describes the surface 505 of the sensor 500 that includes the pixel surface bowing outwards from sensor 500 (i.e. in a direction toward the lens stack array to which the sensor will be aligned) with respect to the expected plane 510 of the surface. The warpage may be caused by factors including (but not limited to) CTE mismatches between the material of the sensor and PCB material. For example a sensor generally includes a large amount of silicon and the PCB is made of a material such as, FR4, that has a much larger CTE than silicon Thus, elevated curing temperatures during bare die and/or CSP attachment process(es) as well as actual board manufacturing processes may introduce the convex warpage into the sensor 500.

Figure 6:
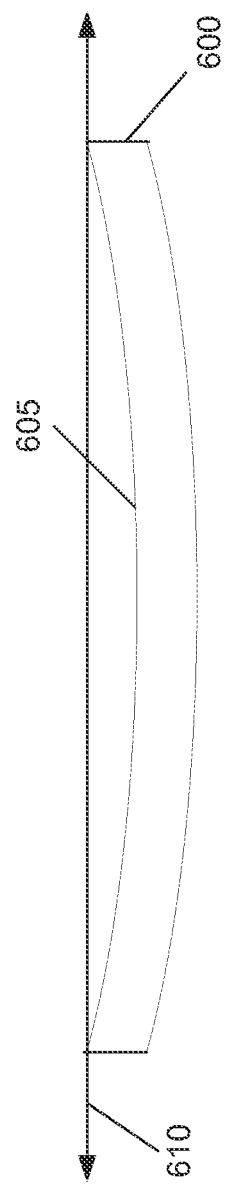
FIG. 6 conceptually illustrates a concave warpage of a sensor of an array camera in accordance with embodiments of this invention.

A sensor having a concave bow in accordance with embodiments of this invention is shown in FIG. 6. One skilled in the art will recognize that a lens stack array may also have a concave bow and the following discussion also applies to a lens stack array. Sensor 600 has concave bow. One skilled in the art will recognize that a concave bow in a sensor typically does not occur. By concave, it is understood that concave describes the surface 605 of the sensor 600 that includes a pixel surface 605 bowing inwards towards sensor 500 (i.e. in a direction away from the lens stack to which the sensor is aligned.

The lens stack array may also have warpage. Warpage in the lens stack array and/or other factors may cause warpage in the projection plane of the images from lens stack array. The BFL-pattern of the warpage in the projection plane of the lens stack array may vary between concave and convex. It is understood that concave and convex describe the shape of the warpage of the lens stack array with respect to the expected plane of the surface of the pixels in the sensor array as described above with reference to the sensor. In a conventional array camera module, the warpage of the lens stack array may be caused by the lens stack array being introduced into a hold over the sensor and/or a variation of the focal planes from the focal planes of a flat lens stack array.

Figure 7:
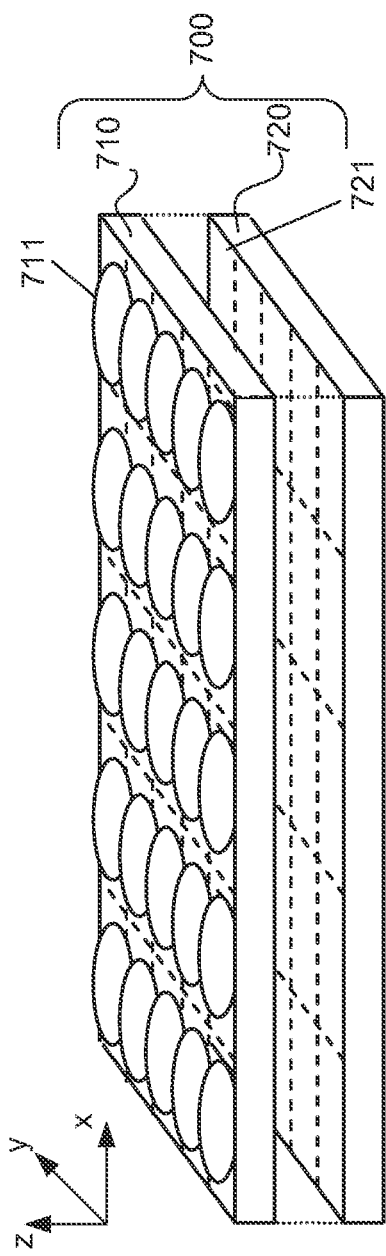
FIG. 7 conceptually illustrates a lens stack array aligned over a sensor in accordance with an embodiment of this invention.

In accordance with some embodiments of this invention, the effective variations in the back focal lengths of the individual lens in the lens stack array causing warpage in the projection plane of the lens stack array are reduced by matching the warpage of the sensor and the warpage of the projection plane of lens stack array such that the curvature signs of the bows for each warpage are substantially equal to one another. The equality of the shape of the deformation in the sensor and the projection plane of the images formed by the lens stack array results in an effective defocusing pattern in the array camera that is substantially free of the bow. The resulting effective variation in the Back Focal Length (BFL) pattern of the array camera module is decreased. The placement of the lens stack array over the sensor in accordance with embodiments of the invention is shown in FIG. 7. In FIG. 7, lens stack array 710 is positioned over sensor 720 such that each individual lens stack 711 is aligned with an individual focal plane of pixels 721 to form array camera module 700.

Figure 8:
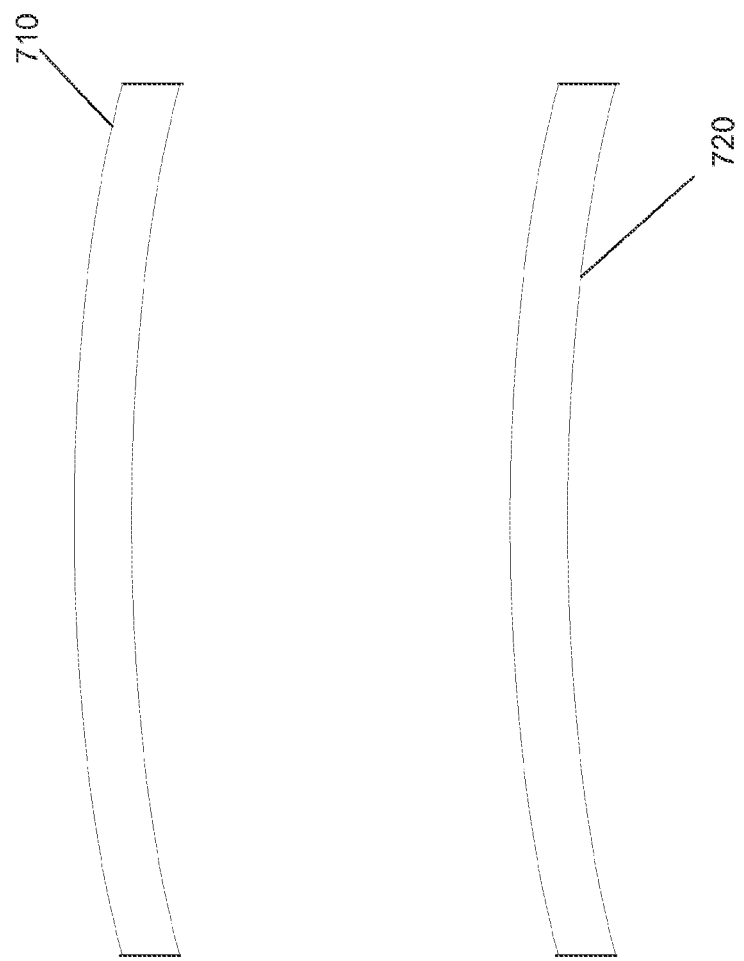
FIG. 8 conceptually illustrates a lens stack array that is designed with a projection plane that has a warpage that is substantially equal to the warpage in a warped sensor in accordance with an embodiment of this invention.

The warpage of each of the lens stack array and sensor of an array camera module in accordance with an embodiment of the invention is shown in FIG. 8. In FIG. 8, sensor 720 has a curvature that is convex in that the warpage causes a pixel surface of sensor 720 to bow outward from sensor 720 toward the lens stack array with respect to the expected plane of the surface of pixels in the sensor 720. Lens stack array 710 has a curvature that is convex in that the warpage of lens stack array 710 causes lens stack array 710 to bow outward from sensor (i.e. away from the sensor) with respect to an expected plane of the surface of pixels in the sensor. Thus, when lens stack array 710 is placed over sensor 720 the warpage of lens stack 710 is the substantially equal to the warpage of sensor 720. Thus, the axial alignment between the individual lens and sensors is maintained. More particularly, the equality in the warpage of each component causes the warpage of the projection plane of the images formed by the lens stack to be substantially equal to the warpage of the sensors. Thus, the projected images from the lens stack array have the same focal distance with respect to the sensor. In accordance with other embodiments, the warpage of the projection plane of images other manners including, but not limited to, adjusting the optics in one or more lens stacks in the lens stack array. One skilled in the art will recognize that either component or both components may have different curvatures signs of the bows, the only requirement being that the warpage of the lens stack array corrects for the warpage of the sensor 720 in accordance with some embodiments of this invention.

Figure 9:
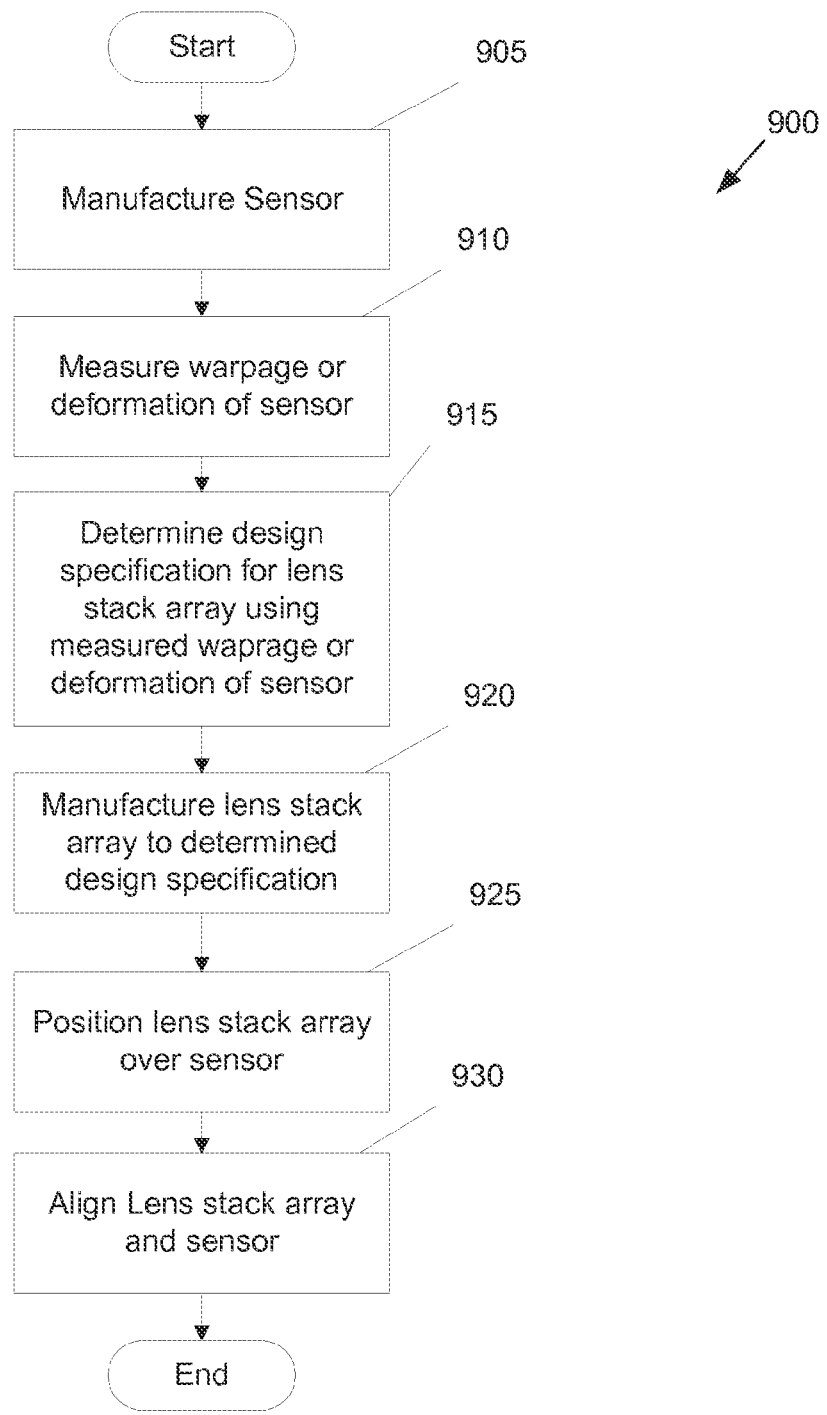
FIG. 9 illustrates a flow diagram of a process for manufacturing an array camera with a lens stack array that is designed with a warpage that is opposite the warpage in a warped sensor in accordance with an embodiment of this invention.

Processes for manufacturing an array camera module that includes a lens stack array incorporating warpage that at least partially corrects warpage in a sensor in accordance with an embodiment of the invention is illustrate in FIG. 9. Process 900 is a process for manufacturing a single array camera module that includes a lens stack array that has warpage that at least partially corrects warpage in a sensor in accordance with an embodiment of the invention. In process 900, a sensor is manufactured using conventional processes (905). In accordance with some embodiments, the flatness requirements of the sensor are relaxed during the manufacture process of the sensor which includes the mounting of the sensor to a PCB. The warpage of the sensor is then measured (910). In accordance with some embodiments, the measurements include a curvature sign of a bow. In accordance with some embodiments, the measurements are performed using testing equipment and the results are provided to processing system, such as a computer. In some embodiments, the results of the measurement are stored to a memory for later use.

The measurements of the warpage are then used to determine the warpage needed in the projection plane of the images formed by the lens stack array. The required warpage needed is then used to generate a design specification for a lens stack array that provides the desired warpage in the projection plane of the images formed by the lens stack array (915). The design specification is a specification that results in a lens stack array that provides a projection plane that has a warpage that corrects for the warpage in the sensor. In accordance with some embodiments, the correction causes the projection plane of the lens stack array to have of curvature sign of a bow that is the same as that the curvature signs of the sensor. The design specification can be generated by a computer system that receives the measurements from the testing equipment and applies design algorithms to the measurement results to determine the proper design specification based upon the desired warpage of the projection plane.

The design specification is then used to generate a lens stack array to match the measured sensor (920). Conventional processes such as, but not limited to WLO techniques can be used to manufacture the lens stack array in accordance with embodiments of the invention. The manufactured lens stack can then be placed over (925) and aligned (930) with the sensor using conventional processes to form an array camera module.

Although specific embodiments of a process for manufacturing an array camera module in accordance with an embodiment of this invention are described above with reference to FIG. 9, other processes may be used to manufacture an array camera module in accordance with other embodiments of this invention.

Figure 10:
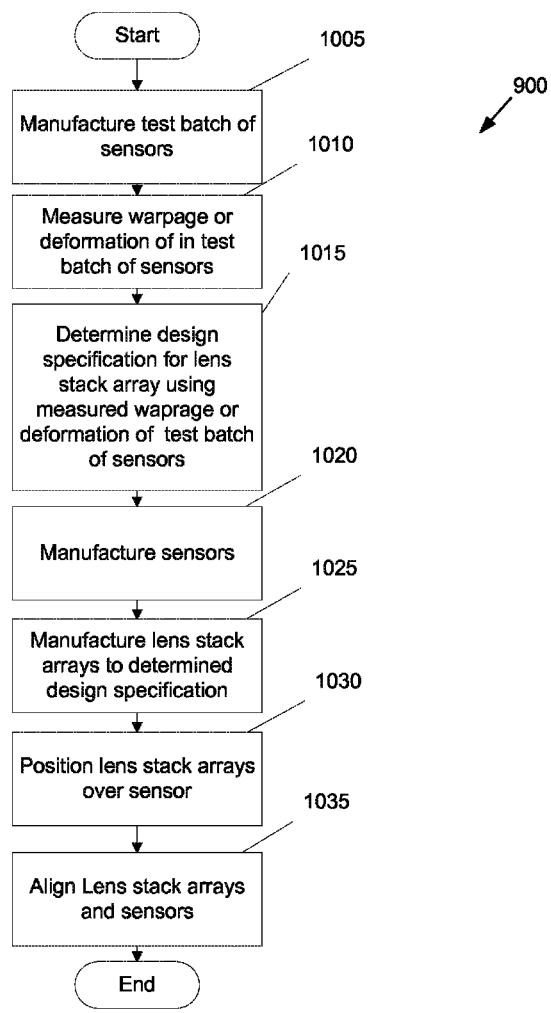
FIG. 10 illustrates a flow diagram of a process for mass manufacture of an array camera with a lens stack array that is designed with a warpage that is opposite the warpage in a warped or deformed sensor in accordance with an embodiment of this invention.

The making of a specific lens stack array for a specific sensor may be too expensive and too time intensive for mass production of array camera modules. Thus, alternative process for manufacturing array camera modules may use lens stack modules that are configured to correct average warpage of manufactured sensors and/or warpages that are replicated across multiple sensors by the sensor manufacturing process. A flow chart of a process for the mass manufacture of array camera modules having lens stack arrays that are designed to correct the average warpage of manufactured sensors in accordance with an embodiment of this invention is shown in FIG. 10. Process 1000 includes manufacturing a test group of sensors (1005). In accordance with some embodiments, the flatness requirements of the sensors are relaxed during the manufacturing and/or packaging process of the sensors. The warpage of each sensor in the test group of sensors can then be measured (1010). In accordance with some embodiments, the measurements include a determination of the curvature of each sensor. In accordance with many embodiments, the measurements are performed using testing equipment and the results are provided to a processing system, such as a computer. In several embodiments, the results of the measurement are stored to a memory for later use.

The measurements of the warpage of the test group of sensors are then used to determine one or more design specifications for a lens stack array(s) (1015). The design specification is a specification that results in a lens stack array that provides a projection plane of the images formed by the lens having a warpage of the projection plane of the images formed by the lens stack array (either by respective mechanical deformation of the lens stack array itself, or by incorporation of the respective BFL-variation) that at least partially corrects for the average warpage in the test group of sensors. In accordance with some embodiments, the warpage of the projection plane of the lens stack array is achieved by mechanical deformation of the lens stack array itself. In accordance with some other embodiments, the warpage of the projection plane of the lens stack is achieved by BFL-variation of the optics in the individual lens stacks in the array. In accordance with some embodiments, the correction causes the projection plane of the lens stack array to have of a curvature that is identical to the curvature observed in the initial group of sensors. The design specification can be generated by a computer system that receives the measurements from the testing equipment and applies design algorithms to the measurement results to determine the proper design specification for the lens stack array that corrects for the warpage in the sensor.

Sensors can be manufactured in accordance with the previous processes used to manufacture the test group of sensors (1020). The design specification can then be used to generate lens stack arrays to match the manufactured sensors (1025). Conventional processes such as, but not limited to WLO techniques can be used to manufacture the lens stack array in accordance with embodiments of the invention. The manufactured lens stack can then be placed over (1030) and aligned with the sensor (1035) using conventional processes.

Although specific embodiments of a process for manufacturing array camera modules in accordance with an embodiment of this invention are described above with reference to FIG. 10, other processes may be used to manufacture an array camera module in accordance with other embodiments of this invention.

Although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

What is claimed is:

1. An array camera comprising:
an array camera module including:
a sensor including an array of pixels that is subdivided into a plurality of sub-arrays of pixels, where each of the plurality of sub-arrays forms a focal plane; and
a lens stack array comprising a plurality of lens stacks wherein each of the plurality of lens stacks includes an aperture and forms an image on a focal plane formed by one of the plurality of sub-array of pixels on the sensor;
wherein the surface of the sensor on which images are formed by the lens stack array includes a warpage;
wherein a projection plane of images formed by the lens stack array incorporates a warpage that at least partially corrects the warpage in the sensor.

2. The array camera of claim 1 wherein the warpage of the sensor has a curvature of a bow that is convex.

3. The array camera of 2 wherein the warpage of the focal plane of the lens stack array has a curvature of a bow that is convex.

4. The array camera of 1 wherein the curvature of the warpage of the focal of the lens stack array is substantially equal to the curvature of the warpage of the sensor.

5. The array camera of claim 1 wherein the warpage of the lens stack array corrects the warpage of the sensor to provide back focal lengths for each of the plurality lens stacks in the lens stack array that are substantially consistent.

6. A method for manufacturing an array camera module comprising:
manufacturing a sensor including an array of pixels that is subdivided into a plurality of sub-arrays of pixels wherein each of the plurality of sub-arrays forms a focal plane;
measuring a warpage of the sensor to generate warpage information;
generating a design for a lens stack array comprising a plurality of lens stacks wherein each of the plurality of lens stacks is associated with a focal plane formed by one of the plurality of sub-array of pixels in the sensor and wherein the lens stack array is configured to have a projection plane of images formed by the lens stack array that has a warpage that corrects the warpage in the sensor based upon the warpage information for the sensor;
manufacturing the lens stack array in accordance with the generated design; and
placing the lens stack array over the sensor to form an array camera module.

7. The method of claim 6 further comprising:
aligning the lens stacks in the lens stack array with focal planes formed by the plurality of sub-arrays in the sensor.

8. The method of claim 6 wherein the warpage of the lens stack array corrects the warpage of the sensor to provide back focal lengths for each of the plurality of lens stacks in the lens stack array that are substantially consistent.

9. The method of claim 6 wherein the warpage of the sensor has a curvature of a bow that convex.

10. The method of 9 wherein the warpage of the projection plane of lens stack array has a curvature of a bow that is convex.

11. The method of 9 wherein the curvature of the warpage of the projection plane of the lens stack array is substantially equal to the curvature of the warpage of the sensor.

12. The method of claim 6 wherein the flatness requirements for the sensor are relaxed during the manufacturing and packaging of the sensor.

13. A method for mass manufacturing an array camera module comprising:
   manufacturing a first plurality of sensors wherein each of the plurality of sensors includes an array of pixels that is subdivided into a plurality of sub-arrays of pixels wherein each of the plurality of sub-arrays forms a focal plane;
   measuring a warpage of each of the first plurality of sensors to generate warpage information;
   generating a design for a lens stack array comprising a plurality of lens stacks wherein each of the plurality of lens stacks is associated with a focal plane formed by one of the plurality of sub-array of pixels in the sensor and wherein the lens stack array is configured to have a projection plane of images formed by the lens stack array that has a warpage that corrects the warpage in the sensor based upon the warpage information for the first plurality of sensor;
   manufacturing a second plurality of sensors in accordance with a process used to manufacture the first plurality of sensors;
   manufacturing a plurality of lens stack arrays in accordance with the generated design; and
   placing a one of the lens stack arrays over one of the second plurality of sensors to form array camera modules.

14. The method of claim 13 further comprising:
   aligning the lens stacks in each of the plurality of lens stack arrays with focal planes formed by the plurality of sub-arrays in each of the second plurality of sensors.

15. The method of claim 13 wherein the warpage in the lens stack array design corrects the warpage of the first plurality of sensors to provide back focal lengths for each of the plurality of lens stacks in the lens stack array that are substantially consistent when placed over the second plurality of sensors.

16. The method of claim 13 wherein the warpage of the first and second plurality of sensors has a curvature of a bow that convex.

17. The method of 16 wherein the warpage of the projection planes of the plurality of lens stack arrays have a curvature of a bow that is convex.

18. The method of 16 wherein the curvature of the warpage of the projection planes of the plurality of lens stack arrays is substantially equal to a curvature of bow of the warpage of the plurality of sensors.

* * * * *